(12) United States Patent
Fujioka et al.

(10) Patent No.: US 8,115,376 B2
(45) Date of Patent: Feb. 14, 2012

(54) LIGHT-EMITTING DISPLAY WITH AUXILIARY WIRING SECTION AND METHOD OF MANUFACTURING THE SAME

(75) Inventors: Hirofumi Fujioka, Kanagawa (JP); Nobuo Ozawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 200 days.

(21) Appl. No.: 12/304,094

(22) PCT Filed: Jun. 7, 2007

(86) PCT No.: PCT/JP2007/061511
§ 371 (c)(1),
(2), (4) Date: Dec. 9, 2008

(87) PCT Pub. No.: WO2007/148540
PCT Pub. Date: Dec. 27, 2007

(65) Prior Publication Data
US 2010/0244664 A1    Sep. 30, 2010

(30) Foreign Application Priority Data

Jun. 19, 2006  (JP) .................................. 2006-168906

(51) Int. Cl.
*H01J 1/62*    (2006.01)
*H01J 63/04*   (2006.01)
(52) U.S. Cl. ........ 313/500; 313/498; 313/506; 313/512; 445/24
(58) Field of Classification Search .......... 313/498–512; 445/24–25
See application file for complete search history.

(56) References Cited

U.S. PATENT DOCUMENTS

| | | | | |
|---|---|---|---|---|
| 2004/0108810 A1* | 6/2004 | Tsujimura et al. | ............. | 313/506 |
| 2004/0256980 A1* | 12/2004 | Tsuchiya | ....................... | 313/503 |
| 2005/0194890 A1* | 9/2005 | Koo et al. | ..................... | 313/503 |
| 2005/0200270 A1* | 9/2005 | Kwak et al. | .................... | 313/502 |
| 2005/0212420 A1* | 9/2005 | Sakakura et al. | ............. | 313/512 |
| 2005/0242713 A1* | 11/2005 | Yamazaki | ...................... | 313/503 |
| 2005/0258745 A1* | 11/2005 | Tsujimura et al. | ............ | 313/506 |
| 2006/0082293 A1* | 4/2006 | Kang et al. | .................... | 313/506 |
| 2006/0113900 A1* | 6/2006 | Oh | ............................... | 313/504 |
| 2006/0125390 A1* | 6/2006 | Oh | ............................... | 313/506 |
| 2006/0255725 A1* | 11/2006 | Kim | .............................. | 313/506 |

FOREIGN PATENT DOCUMENTS

| | | |
|---|---|---|
| JP | 2002-318556 | 10/2002 |
| JP | 2005-093397 | 4/2005 |
| JP | 2005-327674 | 11/2005 |
| JP | 2006-011059 | 1/2006 |
| JP | 2006-106575 | 4/2006 |
| JP | 2006-113376 | 4/2006 |

OTHER PUBLICATIONS

International Search Report dated Aug. 21, 2007.

\* cited by examiner

*Primary Examiner* — Bumsuk Won
*Assistant Examiner* — Kevin Quarterman
(74) *Attorney, Agent, or Firm* — SNR Denton US LLP

(57) ABSTRACT

A light-emitting display capable of maintaining low power consumption and improving display quality irrespective of the configuration of an auxiliary wiring is provided. A second electrode 20 and an auxiliary wiring 18B are electrically connected to each other through a conductive contact section 15B. Moreover, only a part of the auxiliary wiring 18B is connected to the contact section 15B. Even if the surface of the auxiliary wiring 18B is oxidized, an increase in connection resistance is prevented. Moreover, a restriction on layout is not imposed at the time of forming the contact section 15B.

19 Claims, 20 Drawing Sheets

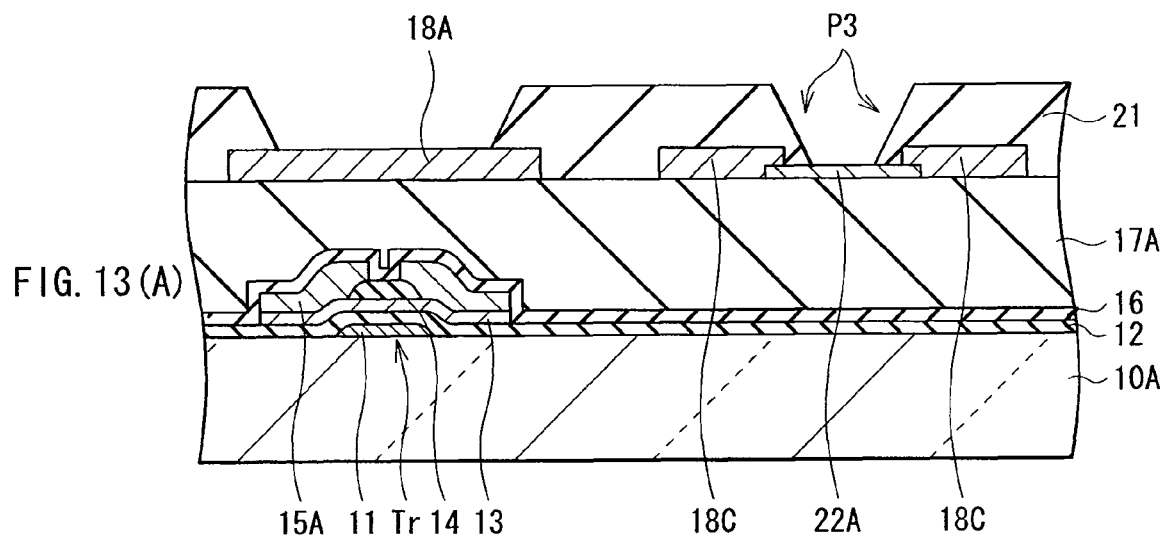
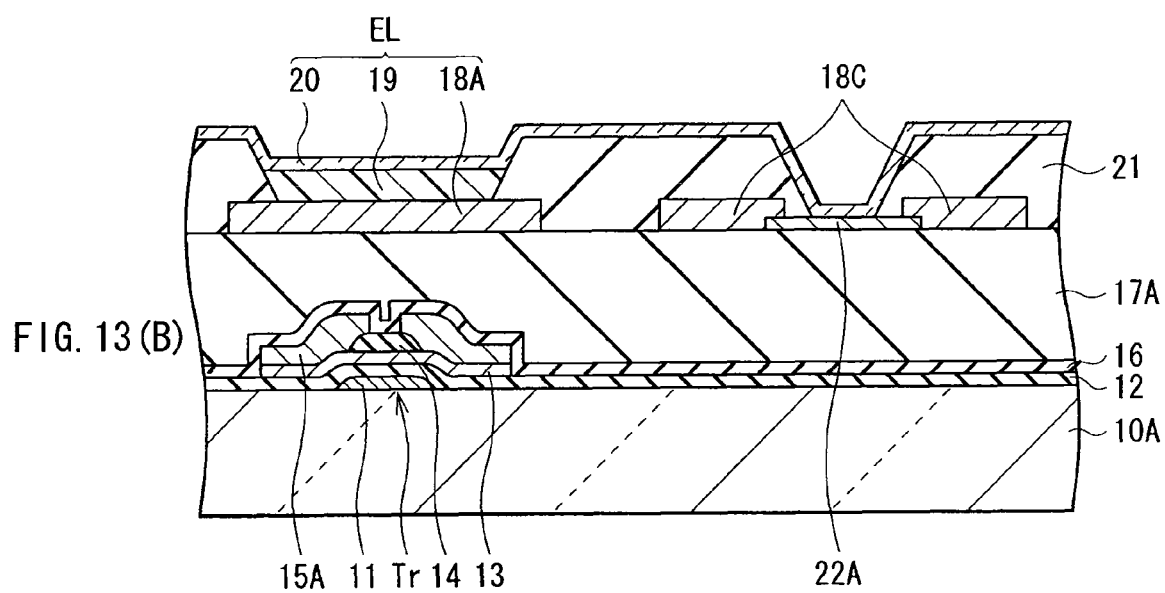

LIGHT-EMITTING DISPLAY WITH AUXILIARY WIRING SECTION AND METHOD OF MANUFACTURING THE SAME

TECHNICAL FIELD

The present invention relates to a top emission system light-emitting display and a method of manufacturing such a light-emitting display.

BACKGROUND ART

In recent years, as one of flat panel displays, organic EL displays displaying an image through the use of an organic EL (Electro Luminescence) phenomenon have received attention. The organic EL displays use the light-emitting phenomenon of an organic light-emitting device, so the organic EL displays have superior characteristics such as a wide viewing angle and low power consumption. Moreover, the organic EL displays have high responsivity to a high-definition high-speed video signal, so the organic EL displays has been developed toward practical use specifically in a video field or the like.

As a drive system in the organic EL displays, an active matrix system using a thin film transistor (TFT) as a drive element is superior in responsivity and resolution, compared to a passive matrix system, and in the organic EL displays having the above-described characteristics, the active matrix system is particularly considered as a suitable drive system. An active matrix type organic EL display includes a drive panel in which an organic EL element including an organic light-emitting layer and a drive element (the above-described thin film transistor) for driving the organic EL display element are arranged, and has a configuration in which the drive panel and a sealing panel are bonded together by an adhesive layer so that the organic EL element is sandwiched between the drive panel and the sealing panel. Moreover, the organic EL element has a configuration in which the organic light-emitting layer is formed between a pair of electrodes.

There are a bottom emission system organic EL display which emits light from each organic EL element to the above-described drive panel side and a top emission system organic EL display which emits the light to the opposite direction, that is, the above-described sealing panel side; however, the latter is a mainstream of development, because the latter can increase an aperture ratio.

Here, in the top emission system organic EL display, an electrode on a light extraction side, that is, on the sealing panel side is a common electrode for each organic EL element, and is made of, for example, a light-transmissive conductive material such as ITO (Indium Tin Oxide). However, such a light-transmissive conductive material has resistivity a few orders of magnitude higher than that in a typical metal material. Therefore, a voltage applied to the electrode on the light extraction side becomes nonuniform in a plane, so there is an issue that positional variations in light emission luminance among organic EL elements occur, and display quality declines.

Therefore, for example, Patent Document 1 discloses a technique in which an auxiliary wiring for being connected to an electrode on a light extraction side is formed of the same material as that of an electrode on a drive panel side in the same layer as the electrode on the drive panel side.

[Patent Document 1] Japanese Unexamined Patent Application Publication No. 2002-318556

DISCLOSURE OF THE INVENTION

It is considered that when an auxiliary wiring is formed of a material with lower resistivity than that of an electrode on a light extraction side and is connected to the electrode on the light extraction side in such a manner, the above-described in-plane nonuniformity of an electrode voltage can be reduced to some extent.

However, in the above-described technique in Patent Document 1, in the case where, for example, aluminum (Al) or an Al alloy is used for a surface of an electrode on a drive panel side, when the auxiliary wiring is formed of the same material as that of the electrode, the surface of the auxiliary wiring is easily oxidized. When the surface is oxidized, connection resistance between the auxiliary wiring and the electrode on the light extraction side is increased to cause a large voltage drop in this part. Therefore, the power consumption of a display is increased due to an increase in voltage drop.

Thus, in the conventional technique, it is difficult to prevent an increase in power consumption irrespective of the configuration of the auxiliary wiring and improve display quality by achieving in-plane uniformity of an electrode voltage on the light extraction side.

In view of the foregoing, it is an object of the invention to provide a light-emitting display capable of maintaining low power consumption and improving display quality irrespective of the configuration of an auxiliary wiring, and a method of manufacturing such a light-emitting display.

A light-emitting display according to the invention including a plurality of drive elements, and a wiring section electrically connected to the drive elements, the light-emitting display includes: a plurality of first electrodes formed corresponding to the drive elements, respectively, on the drive elements and the wiring section; a plurality of light emission sections formed on the first electrodes, respectively; a common second electrode formed of a material allowing light from the light emission sections to pass therethrough, and arranged on the plurality of light emission sections; an auxiliary wiring section with lower resistance than that of the second electrode; and a conductive contact section electrically connecting between the second electrode and the auxiliary wiring section.

In the light-emitting display according to the invention, the second electrode and the auxiliary wiring are electrically connected to each other through the conductive contact section, so even if the surface of the auxiliary wiring is oxidized, an increase in connection resistance is prevented.

A method of manufacturing a light-emitting display according to the invention includes: a step of forming a plurality of drive elements and a wiring section on a substrate, and electrically connecting between the plurality of drive elements and the wiring section; a step of forming a first conductive layer on the drive elements and the wiring section; a step of forming a plurality of first electrodes corresponding to the plurality of drive elements, respectively, as well as an auxiliary wiring section by patterning the first conductive layer; a step of forming a light emission section on each of the first electrodes; a step of forming a common second electrode of a material allowing light from each light emission section to pass therethrough on a plurality of the light emission sections; and a step of forming a conductive contact section, and electrically connecting between the second electrode and the auxiliary wiring section through the contact section, wherein the auxiliary wiring section is formed of a material with lower resistance than that of the second electrode.

In the light-emitting display and the method of manufacturing a light-emitting display according to the invention, it is preferable that one conductive layer be formed, and the above-described wiring section and the contact section be formed by patterning the conductive layer. In the case where they are formed in such a manner, the wiring layer and the contact section can be formed in the same step, so manufacturing steps are simplified.

According to the light-emitting display or the method of manufacturing a light-emitting display of the invention, the second electrode and the auxiliary wiring are electrically connected to each other through the conductive contact section, so even if the surface of the auxiliary wiring is oxidized, an increase in connection resistance can be prevented. Therefore, irrespective of the configuration of the auxiliary wiring, low power consumption can be maintained, and display quality can be improved.

BRIEF DESCRIPTION OF THE DRAWINGS

FIG. 13 is a sectional view showing a step following FIG. 12.

BEST MODES FOR CARRYING OUT THE INVENTION

Preferred embodiments of the invention will be described in detail below referring to the accompanying drawings.

First Embodiment

Figure 1:
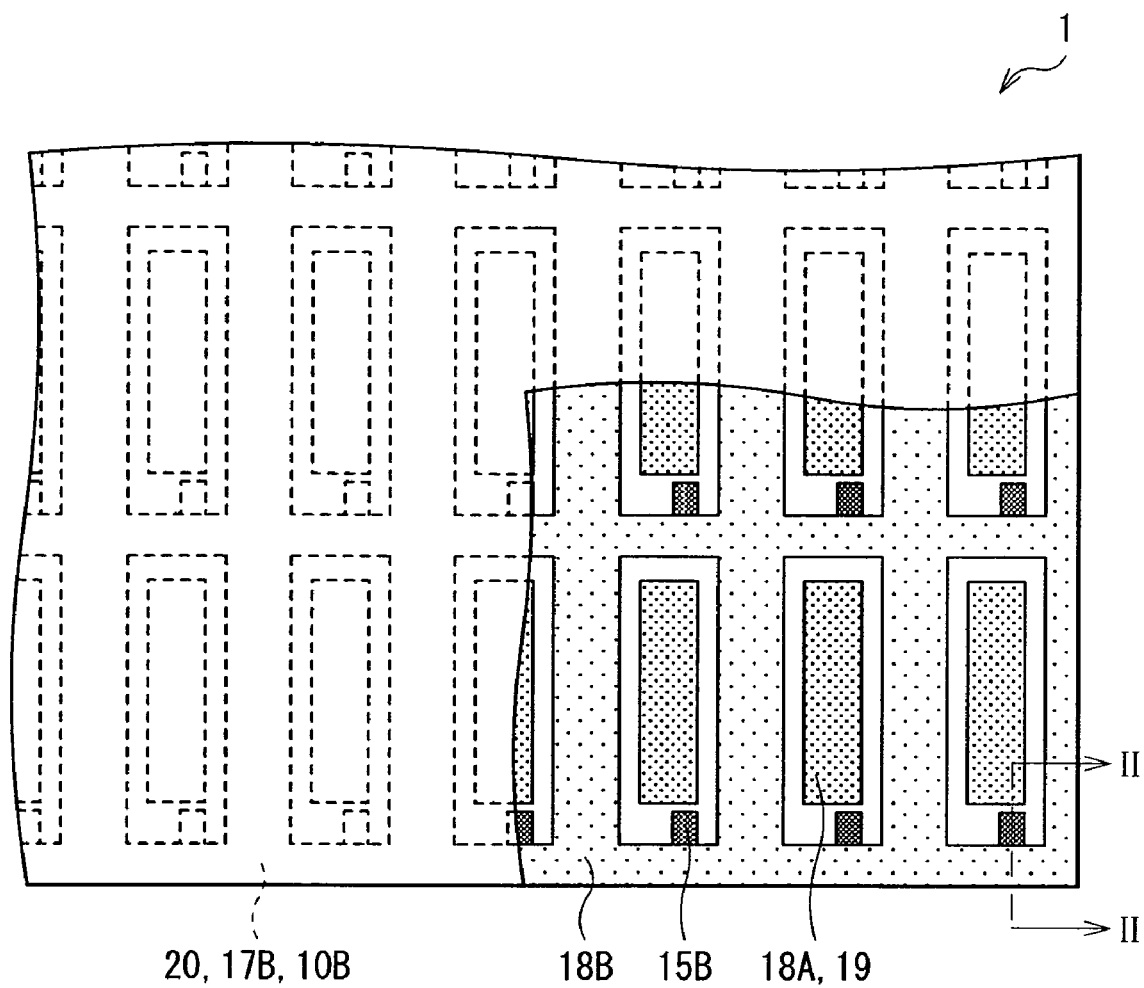
FIG. 1 is a plan view showing the configuration of a light-emitting display according to a first embodiment of the invention.
Figure 2:
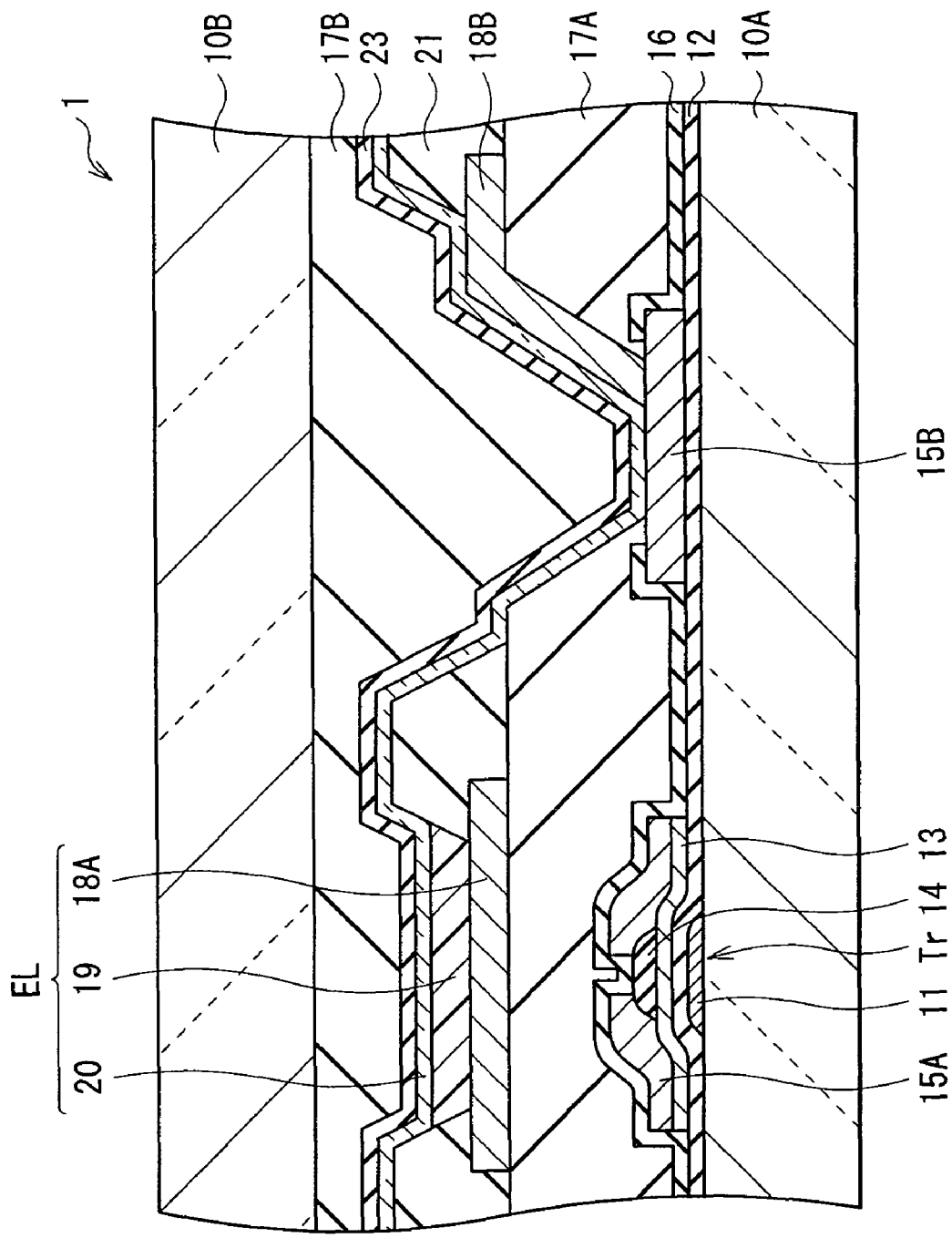
FIG. 2 is a sectional view showing the configuration of the light-emitting display shown in FIG. 1.

FIGS. 1 and 2 show the configuration of a light-emitting display (an organic EL display 1) according to a first embodiment of the invention, and FIG. 1 shows a plan configuration and FIG. 2 shows a sectional configuration taken along a line II-II of FIG. 1.

The organic EL display 1 has a laminate configuration in which a multilayer film is laminated between a pair of insulating transparent substrates 10A and 10B. More specifically, a gate electrode 11, a gate insulating film 12, a silicon film 13, a stopper insulating film 14 and a wiring layer 15A are laminated from the transparent substrate 10A side to constitute a thin film transistor Tr. Moreover, a passivation insulating film 16 and a planarization insulating film 17A are laminated on the thin film transistor Tr. On the planarization insulating film 17A, an organic EL element EL is formed corresponding to a region where the thin film transistor Tr is formed.

Each organic EL element EL has a laminate configuration in which a first electrode 18A, an organic light-emitting layer 19 and a second electrode 20 are laminated in order from the planarization insulating film 17A side. Among them, the first electrode 18A and the organic light-emitting layer 19 are separated from other first electrodes 18A and other light-emitting layers 19 by an interelectrode insulating film 21 on the planarization insulating film 17A, and the first electrodes 18A and the organic light-emitting layers 19 both having a rectangular shape shown in, for example, FIG. 2 are arranged in a matrix form between the transparent substrates 10A and 10B. On the other hand, the second electrode 20 is a common electrode for the organic EL elements EL, and as shown in FIG. 2, the second electrode 20 is uniformly formed between the transparent substrates 10A and 10B.

As shown in FIGS. 1 and 2, an auxiliary wiring 18B is formed in the same layer as the first electrode 18A in a region corresponding to a region between the thin film transistors Tr, the first electrodes 18A and the organic light-emitting layers 19. Moreover, in the planarization insulating film 17A and the interelectrode insulating film 21, a forward tapered aperture having a wide top and a narrow bottom is arranged in a part of a region where the auxiliary wiring 18B is formed (refer to FIG. 1). Between a bottom part of the aperture and the gate insulating film 12, a conductive contact section 15B is formed in the same layer as the wiring layer 15A, and the second electrode 20 and the auxiliary wiring 18B are electrically connected to each other on the contact section 15B.

Moreover, a protective film 23 is uniformly formed on the second electrode 20, and a sealing resin 17B is uniformly formed between the protective film 23 and the transparent substrate 10B. By such a configuration, the organic EL display 1 emits light emitted from the organic light-emitting layer 19 eventually from the second electrode 20 side (the transparent substrate 10B side), that is, from the top, so the organic EL display 1 has a so-called top emission type configuration.

The transparent substrates 10A and 10B are made of, for example, an insulating material such as a glass material or a plastic material.

The thin film transistor Tr is a drive element for driving each organic EL element EL to emit light. In the thin film transistor Tr, the gate electrode 11 is made of, for example, molybdenum (Mo) or the like. Moreover, the silicon film 13 is a section where a channel region of the thin film transistor Tr is formed, and is configured of, for example, an amorphous silicon film or the like.

The wiring layer 15A forms a gate electrode and a drain electrode of the thin film transistor Tr, and functions as wiring such as a signal line. The wiring layer 15A is made of the same material as that of the contact section 15B as will be described later. More specifically, for example, the wiring layer 15A is made of, for example, a conductive material which is resistant to surface oxidation and establishes a good connection (desirably an ohmic connection) between the wiring layer 15A and the second electrode 20. Moreover, as will be described later, a material showing high etching selectivity with respect to the first electrode 18A is preferable. More specifically, for example, titanium (Ti), titanium nitride (TiN), tungsten (W), chromium (Cr), gold (Au), platinum (Pt), copper (Cu), ITO, IZO (Indium Zinc Oxide) and silver (Ag), an alloy including any one of these metal materials as a main component, and the like are cited. Moreover, the wiring layer 15A may be configured of a multilayer film having an uppermost layer made of Ti such as Ti/Al (aluminum), Ti/Al/Ti, Ti/(AlSi alloy), Ti/(AlSiCu alloy), or Ti/(AlCe (cerium) alloy). In addition, the material of the wiring layer 15 is appropriately selected by the material of the first electrode 18A, an etching method or the like.

The passivation insulating film 16 is provided to protect the thin film transistor Tr, and is made of, for example, an insulating material including at least one kind selected from the group consisting of $SiO_2$, SiN and SiON. Moreover, the planarization insulating film 17A is provided to planarize a layer configuration and then form the organic EL element EL on the layer configuration, and is made of, for example, an insulating material such as a photosensitive polyimide resin, a polybenzoxazole resin, a novolac resin, polyhydroxystyrene or an acrylic resin.

The organic light-emitting layer 19 includes a hole transport layer, a light-emitting layer and an electron transport layer (all not shown) which are deposited in order, and is held between the first electrode 18A and the second electrode 20. When a predetermined voltage is applied between the first electrode 18A and the second electrode 20, light emission is obtained by carrier recombination of electrons and holes injected into the light-emitting layer.

The first electrode 18A functions as an electrode (an anode electrode or a cathode electrode) for applying a voltage to the organic light-emitting layer 19 as well as a reflecting electrode for reflecting light from the organic light-emitting layer 19 to direct the light upward. Therefore, the first electrode 18A is made of a metal with high reflectivity, for example, Al, an alloy including Al as a main component such as an AlNd (neodymium) alloy or an AlCe alloy. In addition, such a material of the first electrode 18A has a property that its surface is easily oxidized (a surface oxidation property).

The second electrode 20 is also an electrode (an anode electrode or a cathode electrode) for applying a voltage to the organic light-emitting layer 19. The second electrode 20 allows light from the organic light-emitting layer 19 to pass therethrough, and then emits the light upward, so the second electrode 20 is a transparent or semi-transparent electrode. Therefore, the second electrode 20 is made of, for example, ITO or IZO which is a transparent material or a Mg (magnesium)-Ag alloy, Cu, Ag, Mg, Al or the like which is a semi-transparent material.

The auxiliary wiring 18B is formed in a region corresponding to a region between the thin film transistors Tr, the first electrodes 18A and the organic light-emitting layers 19 as described above, and is provided to prevent in-plane nonuniformity of an electrode voltage in the permeable second electrode 20 with high resistance. Therefore, the auxiliary wiring 18B is configured to have lower resistance than the second electrode 20 (for example, is made of a material with low resistivity), and more specifically, the auxiliary wiring 18B is made of the same material as the above-described material of the first electrode 18A.

For example, as shown in FIG. 1, the contact section 15B is provided to establish a partial electrical connection between the second electrode 20 and the auxiliary wiring 18B, and as described above, the contact section 15B is formed of the same material as that of the wiring layer 15A in the same layer as the wiring layer 15A. In other words, the contact section 15B is desirably made of a conductive material which is resistant to surface oxidization and establishes a good connection (desirably an ohmic connection) between the contact section 15B and the second electrode 20, more specifically a material showing high etching selectivity with respect to the first electrode 18A. In addition, the material showing high etching selectivity with respect to the first electrode 18A is used, because although the detail will be described later, at the time of forming the first electrode 18A and the auxiliary wiring 18B by etching, the contact section 15B is prevented from being etched together.

The interelectrode insulating film 21 is provided to separate the organic EL elements EL from one another, and has a side surface with a forward tapered shape having a wide top and a narrow bottom. In this case, the forward tapered shape preferably has as gentle a tilt angle as possible. Moreover, the width of an aperture in the interelectrode insulating film 21 is larger than that of the aperture in the planarization insulating film 17A in which the contact section 15B is formed, and as shown in FIG. 2, the second electrode 20 has a step-like shape having a wide top and a narrow bottom in these aperture portions. Thus, the forward tapered shape has as gentle a tilt angle as possible or the aperture portions are formed in a step-like shape to prevent a break or an increase in resistance at the time of forming the second electrode 20, although the detail will be described later. In addition, the interelectrode insulating film 21 is made of, for example, an insulating material such as photosensitive polyimide resin.

The protective film 23 is provided to protect the second electrode 20, and is made of, for example, an insulating material including at least one kind selected from the group consisting of $SiO_2$, SiN and SiON. Moreover, the sealing resin 17B is provided to planarize a layer configuration and then cover the layer configuration with the transparent substrate 10B.

Here, the thin film transistor Tr corresponds to a specific example of "a drive element" in the invention, and the organic light-emitting layer 19 corresponds to a specific example of "a light emission section" in the invention. Moreover, the planarization insulating film 17A and the interelectrode insulating film 21 correspond to specific examples of "an insulating layer" in the invention.

Next, a method of manufacturing the organic EL display 1 will be described below referring to FIGS. 3 to 5. FIGS. 3 to 5 show sectional views of a part of steps of manufacturing the organic EL display 1.

Figure 3A:
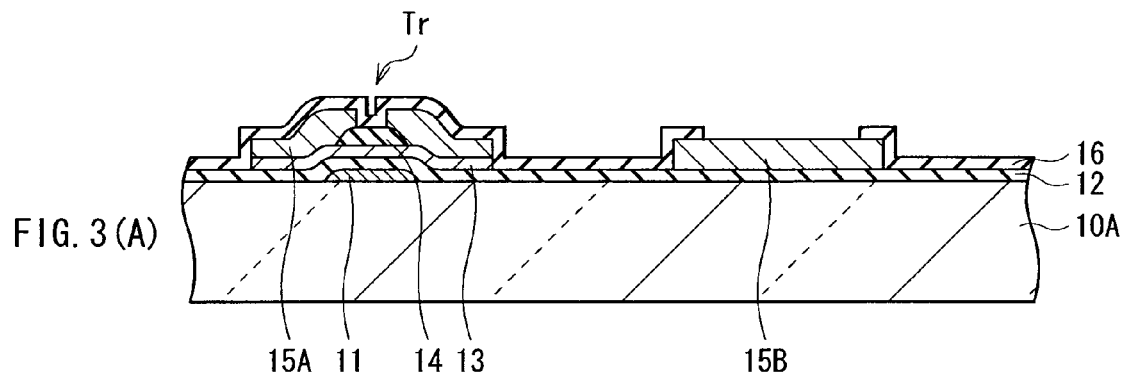
FIG. 3 is a sectional view showing a part of main steps of a method of manufacturing the light-emitting display shown in FIG. 1.

At first, as shown in FIG. 3(A), the gate electrode 11, the gate insulating film 12, the silicon film 13, the stopper insulating film 14 and the wiring layer 15A which are made of the above-described materials are laminated in this order on the transparent substrate 10A made of the above-described material by, for example, a sputtering (chemical vapor deposition) method and a photolithography method to form each of a plurality of thin film transistors Tr in, for example, a matrix form on the transparent substrate 10A.

In this case, when the wiring layer 15A is formed by, for example, a sputtering method, the contact section 15B is also formed of the same material as that of the wiring layer 15A in a part of a region corresponding to a region between the thin film transistors Tr as shown in FIG. 1 on the gate insulating film 12, that is, in the same layer as the wiring layer 15A. The material of the wiring layer 15A and the contact section 15B is appropriately selected by a method of etching a metal layer 18 which will be described later, and, for example, as will be described later, in the case where wet etching is performed by using a mixed acid of a phosphoric acid, a nitric acid and an acetic acid, the wiring layer 15A and the contact section 15B can be configured of a multilayer film of Ti/Al/Ti, and the film thickness of the multilayer film in this case is, for example, approximately Ti/Al/Ti=50 nm/500 nm/50 nm. In addition, in the case of the multilayer film of Ti/Al/Ti, an etching method by RIE (Reactive Ion Etching) is considered; however, in this case, a pattern defect easily occurs, so the etching method by RIE is not preferable.

Next, also as shown in FIG. 3(A), the passivation insulating film 16 made of the above-described material is uniformly formed on the thin film transistors Tr and the contact section 15B by, for example, a CVD method.

Figure 3B:
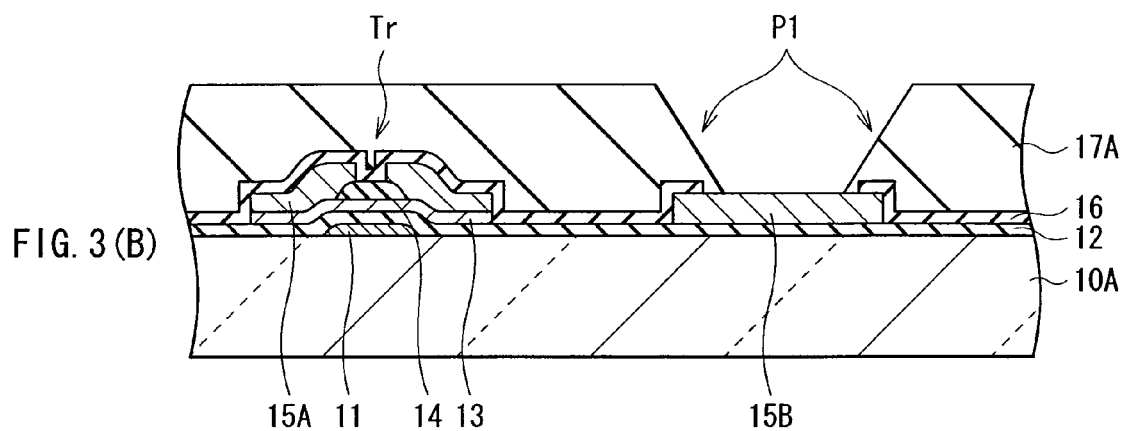

Next, referring to FIG. 3(B), the planarization insulating film 17A made of the above-described material is uniformly formed on the passivation insulating film 16 by coating by, for example, a spin coat method or a slit coat method. Then, a region corresponding to each contact section 15B is exposed and developed by, for example, a photolithography method to form an aperture, and then firing is performed to form an aperture having a side surface with a forward tapered shape shown in a reference numeral P1 in the drawing. At this time, as a photosensitive resin used as the planarization insulating film 17A, such a photosensitive resin that the tilt angle of the aperture becomes as gentle as possible is appropriately selected. To make the tilt angle gentler, the aperture may be formed through the use of a halftone mask, or an exposure process may be performed a plurality of times through the use of a plurality of masks having different sizes of aperture portions. In addition, the tilt angle of the forward tapered shape is appropriately set by the film thickness or the forming method of the second electrode 20 which is formed in a later step.

Figure 4A:
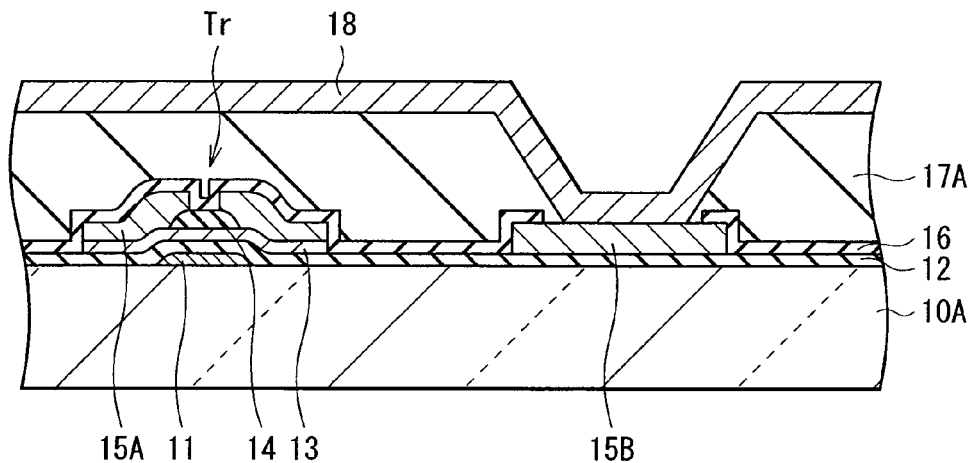
FIG. 4 is a sectional view showing a step following FIG. 3.

Next, as shown in FIG. 4(A), the metal layer 18 with a thickness of, for example, approximately 300 nm is uniformly formed of the above-described material of the first electrodes 18A and the auxiliary wiring 18B (in this example, a metal material) on the planarization insulating film 17A and the contact section 15B by, for example, a sputtering method.

Figure 4B:
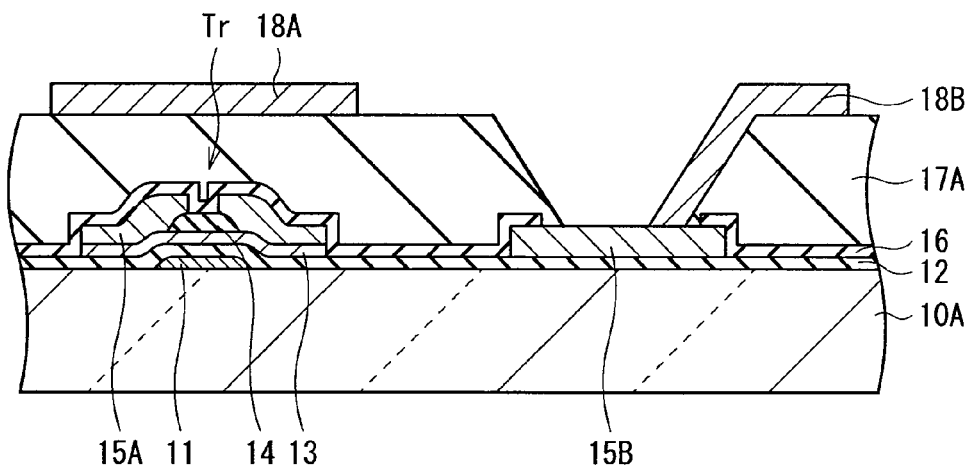

Next, as shown in FIG. 4(B), the metal layer 18 is selectively etched by, for example, a photolithography method to form the first electrodes 18A and the auxiliary wiring 18B which have the shapes shown in FIGS. 1 and 2. At this time, each first electrode 18A is formed in a position corresponding to each thin film transistor Tr, and the auxiliary wiring 18B is formed in a region corresponding to a region between the thin film transistors Tr. Moreover, patterning is performed so that a part of the auxiliary wiring 18B is electrically connected to the contact section 15B. In this case, as described above, the contact section 15B is made of a material with high etching selectivity with respect to the metal layer 18, so when the metal layer 18 is etched, there is no possibility that the contact section 15B is etched together with the metal layer 18. In addition, etching at this time is performed by wet etching using, for example, a mixed acid including a phosphoric acid, a nitric acid and an acetic acid.

Figure 5A:
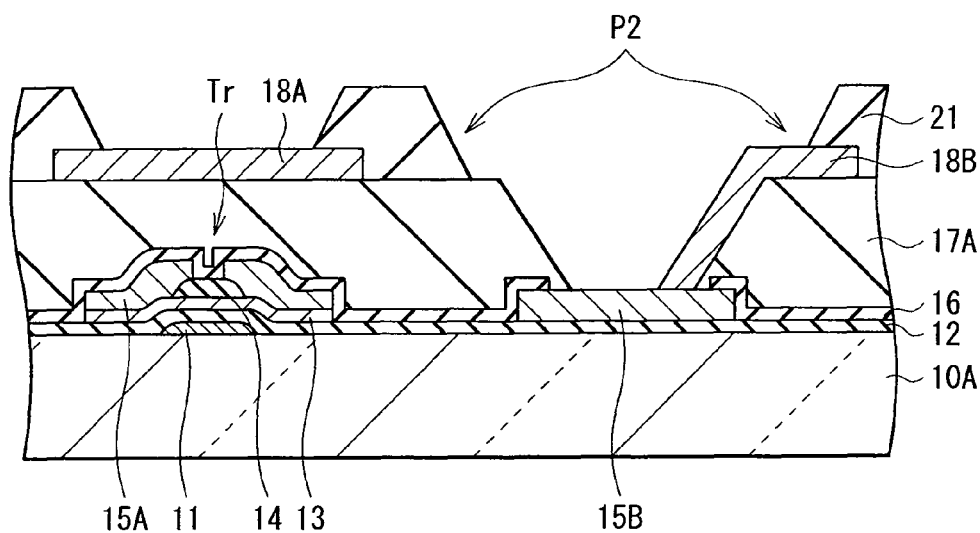
FIG. 5 is a sectional view showing a step following FIG. 4.

Next, as shown in FIG. 5(A), the interelectrode insulating film 21 made of the above-described material is uniformly formed on the planarization insulating film 17A, the first electrodes 18A and the auxiliary wiring 18B by coating by, for example, a spin coat method or a slit coat method, and patterning is performed on the interelectrode insulating film 21 by, for example, a photolithography method so that a predetermined shape is formed, that is, each first electrode 18A and each organic light-emitting layer 19 which is formed in a later step are separated from other first electrodes 18A and other organic light-emitting layers 19. Moreover, at this time, as shown by a reference numeral P2 in the drawing, a region corresponding to the contact section 15B is selectively removed by, for example, a photolithography method to form an aperture having a side surface with a forward tapered shape. To make the tilt angle as gentle as possible in the same manner, the aperture may be formed through the use of a halftone mask, or an exposure process may be performed a plurality of times through the use of a plurality of masks having different sizes of aperture portions. Further, the width of the aperture in the interelectrode insulating films 21 is configured to be larger than that of the aperture in the planarization insulating film 17A, and the side surface of the aperture portion is formed in a step-like shape.

Figure 5B:
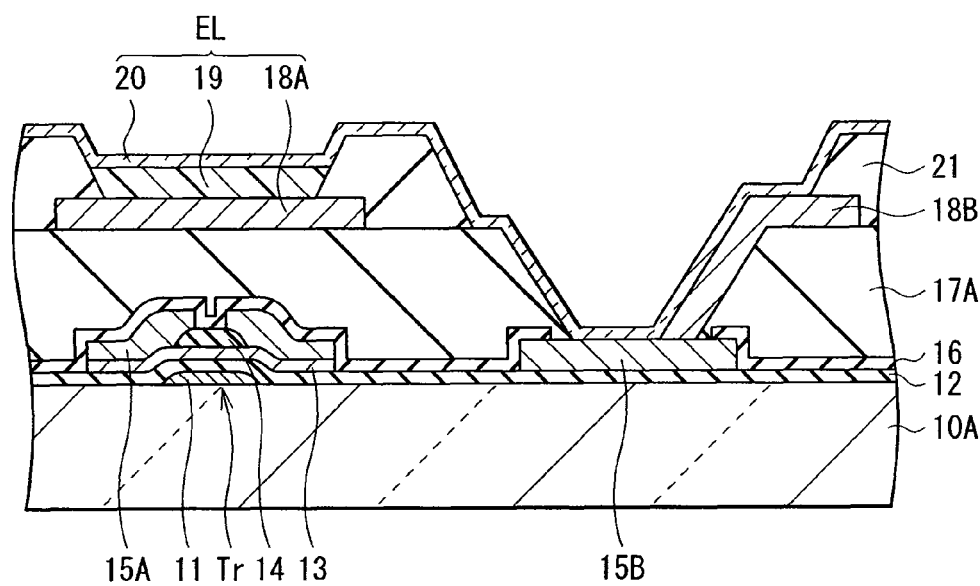

Next, as shown in FIG. 5(B), the organic light-emitting layer 19 is formed on each first electrode 18A by, for example, a vacuum deposition method. Then, the second electrode 20 made of the above-described material with a thickness of, for example, approximately 10 nm is uniformly formed on the organic light-emitting layer 19, the interelectrode insulating film 21, the planarization insulating film 17A, the contact section 15B and the auxiliary wiring 18B by, for example, a vacuum deposition method.

Finally, the protective film 23 made of the above-described material is uniformly formed on the second electrode 20 by, for example, a CVD method, and the sealing resin 17B is uniformly formed on the protective film 23 by, for example, an instillation method, and is covered with the transparent substrate 10B made of the above-described material, thereby the organic EL display 1 according to the embodiment shown in FIGS. 1 and 2 is manufactured.

In the organic EL display 1, when a voltage is applied to the first electrode 18A through the wiring layer 15A and the thin film transistor Tr, the organic light-emitting layer 19 emits light with luminance according to a potential difference between the first electrode 18A and the second electrode 20. The light from the organic light-emitting layer 19 is reflected by the first electrode 18A and passes through the second electrode, thereby the light is emitted upward, that is, to the transparent substrate 10B side in FIG. 2. Then, light on the basis of a pixel signal is emitted from the organic EL element EL arranged in each pixel to display a predetermined image on the organic EL display 1.

In this case, in the organic EL display 1, the second electrode 20 and the auxiliary wiring 18B are electrically connected to each other through the conductive contact section 15B which is resistant to surface oxidization and establishes a good connection (desirably an ohmic connection) between the contact section 15B and the second electrode 20, so even if the surface of the auxiliary wiring 18B made of the same material as that of the first electrode 18A is oxidized, an increase in connection resistance between the second electrode 20 and the auxiliary wiring 18B is prevented.

Figure 6:
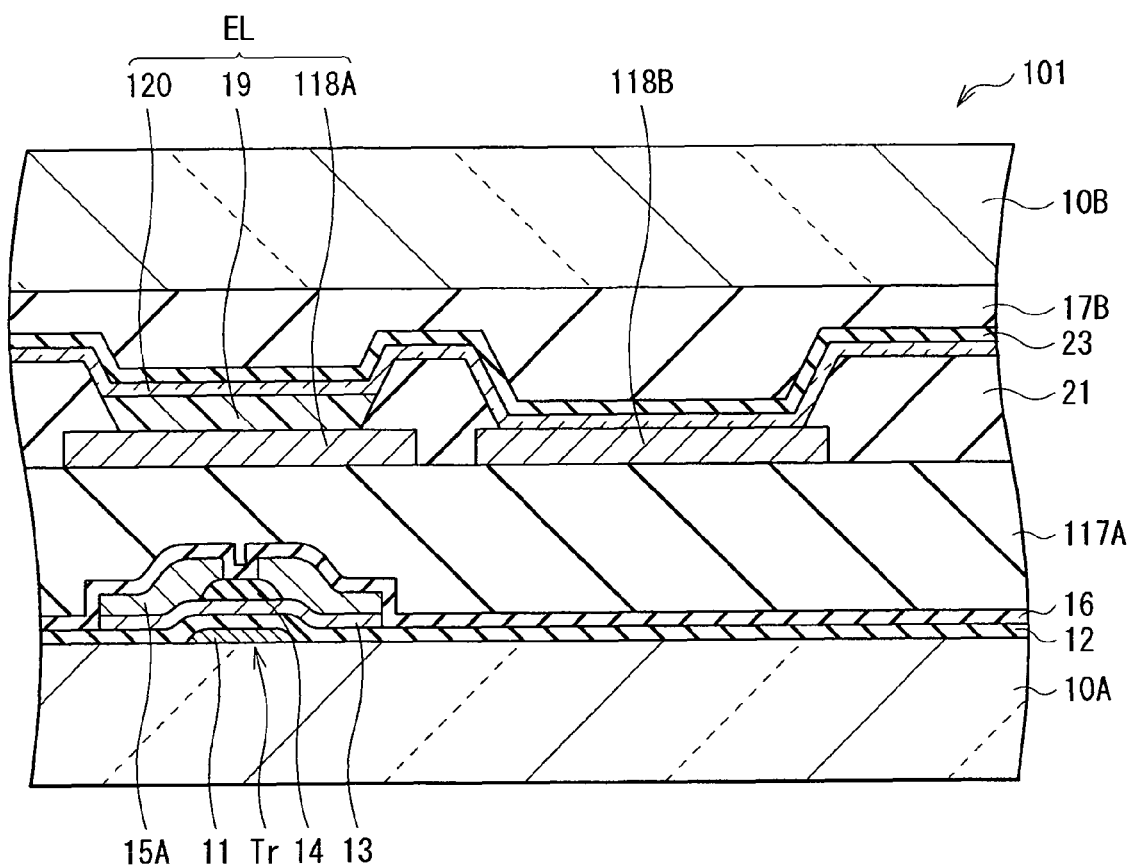
FIG. 6 is a sectional view showing the configuration of a light-emitting display according to a comparative example.

On the other hand, for example, in a conventional organic EL display 101 (a comparative example 1) shown in FIG. 6, an auxiliary wiring 118B is formed of the same material as that of a first electrode 118A in the same layer as the first electrode 118A, and is directly connected to a second electrode 120, so when the surface of the auxiliary wiring 118B is oxidized, connection resistance between the second electrode 120 and the auxiliary wiring 118B is increased.

Figure 7:
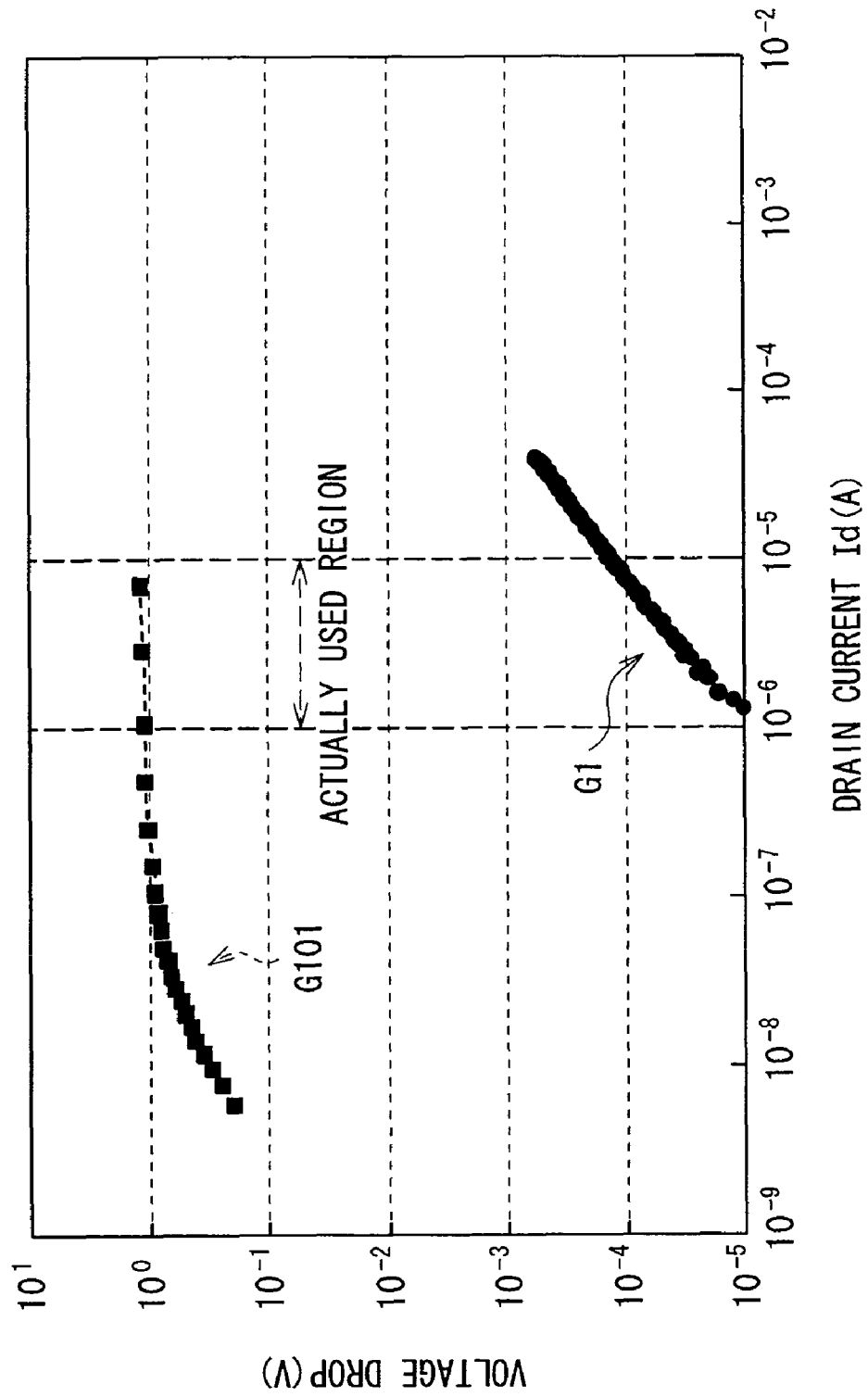
FIG. 7 is a plot showing a relationship between a current flowing between electrodes and a voltage drop in an auxiliary wiring.

Therefore, for example, as shown in FIG. 7, in the comparative example 1 shown by a reference numeral G101, in an actually used region of the thin film transistor Tr (a region having approximately a drain current Id=1 μA to 10 μA), a voltage drop of approximately 1 V occurs due to an increase in the above-described connection resistance, but on the other hand, in the embodiment shown by a reference numeral G1, in the same actually used region, only a voltage drop of approximately 10 μV to 100 μV occurs, and as a result, compared to the comparative example 1, the power consumption of the whole organic EL display is largely reduced.

Figure 8:
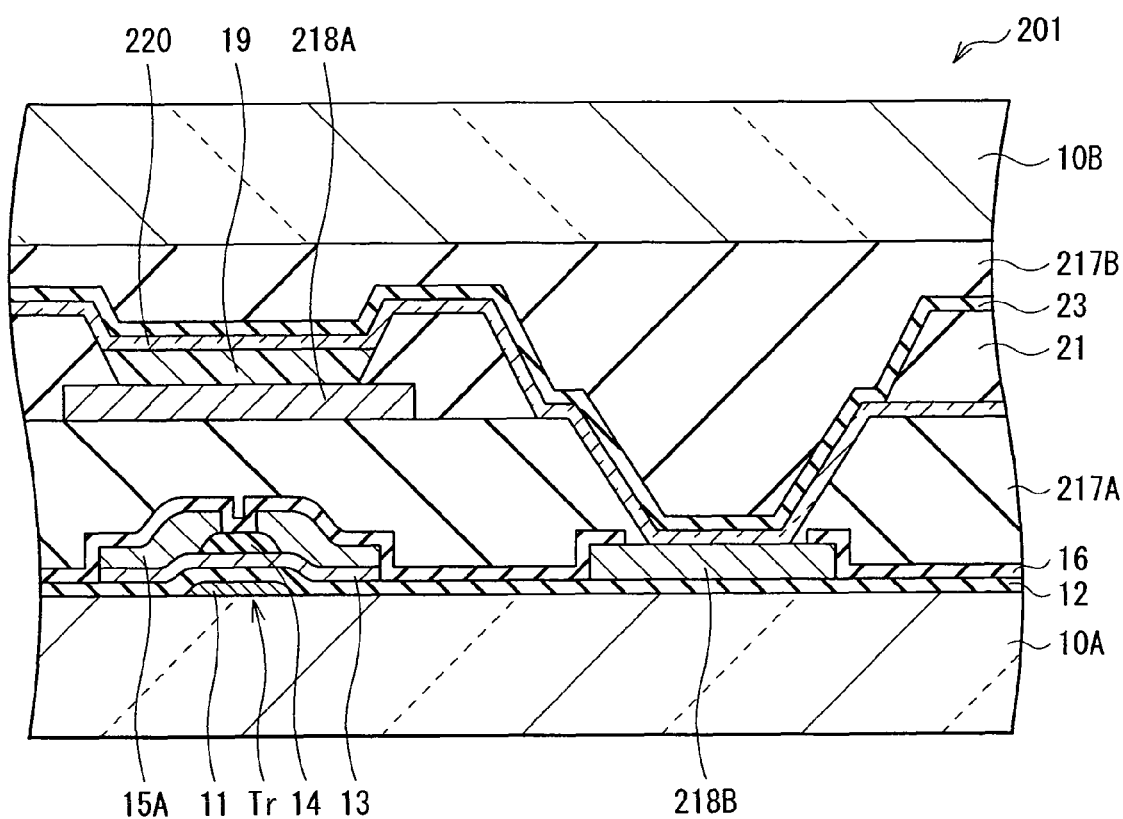
FIG. 8 is a sectional view showing the configuration of a light-emitting display according to another comparative example.

Moreover, for example, as shown in FIG. 8, in another conventional organic EL display 201 (a comparative example 2), an auxiliary wiring 218B is formed of the same material as that of the wiring layer 15A in the same layer as the wiring layer 15A, so an issue of the above-described increase in connection resistance is prevented; however, it is difficult to form the auxiliary wiring 218B due to a restriction on layout imposed by the thin film transistor Tr or the wiring layer 15A. Moreover, even if the auxiliary wiring 218B can be formed, a distance between wirings is very short, so a short circuit between wirings through the auxiliary wiring 218B easily occurs, and the yield of the display declines.

On the other hand, in the organic EL display 1 according to the embodiment, the auxiliary wiring 18B is formed in the same layer as the first electrode 18A, and only a part of the auxiliary wiring 18B positioned in a region corresponding to a region between the first electrodes 18A is connected to the contact section 15B in the same layer as the wiring layer 15A, so when the contact section 15B is formed, there is no possibility that a restriction on layout is imposed by the thin film transistor Tr or the wiring layer 15A.

As described above, in the embodiment, the second electrode 20 and the auxiliary wiring 18B are electrically connected to each other through the conductive contact section 15B, and only a part of the auxiliary wiring 18B is connected to the contact section 15B, so even if the surface of the auxiliary wiring 18B is oxidized, an increase in connection resistance can be prevented, and a restriction on layout is not imposed at the time of forming the contact section 15B. Therefore, while the degree of freedom on layout and low power consumption are maintained, the display quality of the organic EL display can be improved.

Moreover, a restriction on layout is not imposed at the time of forming the contact section 15B, so a short circuit between the contact section 15B and the wiring layer 15A due to an unreasonable layout does not occur, and compared to the conventional organic EL display, manufacturing yields can be improved.

Moreover, the contact section 15B is formed of the same material as that of the wiring layer 15A in the same layer as the wiring layer 15A, so manufacturing steps are not increased by the formation of the contact section 15B, and a manufacturing cost can be maintained. In other words, the wiring layer 15A and the contact section 15B can be formed in the same step, so compared to a second embodiment which will be described later, the manufacturing steps can be simplified.

Further, the contact section 15B is formed of a material with high etching selectivity with respect to the first electrode 18A, so when the metal layer 18 is etched to form the first electrode 18A and the auxiliary wiring 18B, there is no possibility that the contact section 15B is etched together with the metal layer 18. Therefore, the above-described contact section 15B can be reliably formed.

Moreover, the side surfaces of the apertures in the planarization insulating film 17A and the interelectrode insulating film 21 each have a forward tapered shape having a wide top and a narrow bottom, and the width of the aperture in the interelectrode insulating film 21 is larger than the width of the aperture in the planarization insulating film 17A, so a break or an increase in resistance in the second electrode 20 in side surface portions of the apertures can be prevented, and a decline in manufacturing yields due to this can be prevented.

Second Embodiment

Next, a light-emitting display according to a second embodiment of the invention will be described below. In addition, like components are denoted by like numerals as of the first embodiment and will not be further described.

Figure 9:
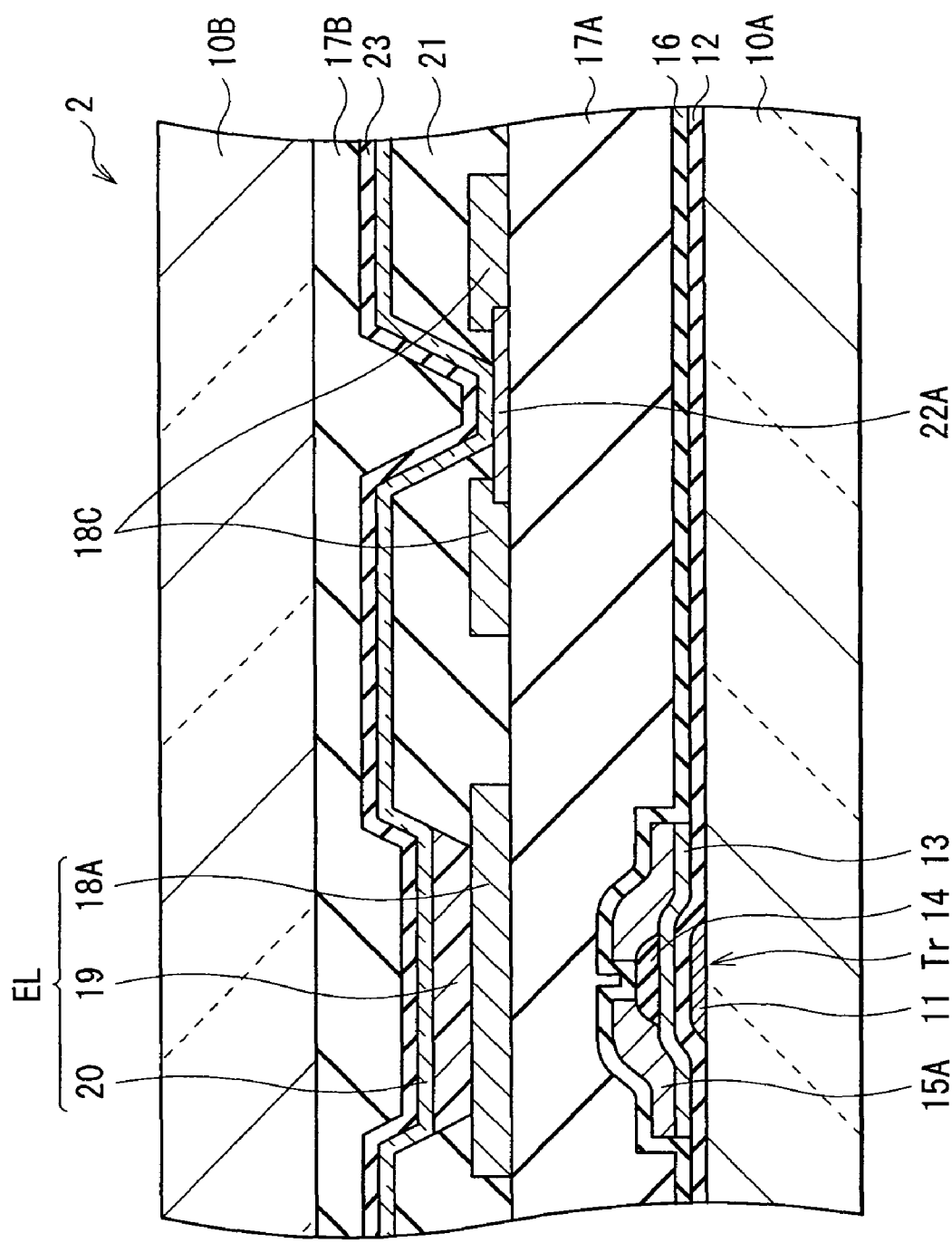
FIG. 9 is a sectional view showing the configuration of a light-emitting display according to a second embodiment.

FIG. 9 shows a sectional configuration of the light-emitting display (an organic EL display 2) according to the embodiment. In the organic EL display 2, a contact section 22A is formed in the same layer as the first electrode 18A and an auxiliary wiring 18C instead of the same layer as the wiring layer 15A. However, the contact section 22A is made of a different material from the materials of the first electrode 18A and the auxiliary wiring 18C. More specifically, as the contact section 22A, such a material that its selectivity is increased at the time of etching the first electrode 18A and the auxiliary wiring 18C is used. Then, as in the case of the first embodiment, the second electrode 20 and the auxiliary wiring 18C are connected to each other through the contact section 22A. In addition, the configurations of other components are the same as those in the organic EL display 1 described in the first embodiment.

Next, a method of manufacturing the organic EL display 2 will be described below referring to FIGS. 10 to 13. FIGS. 10 to 13 show sectional views of a part of steps of manufacturing the organic EL display 2.

Figure 10A:
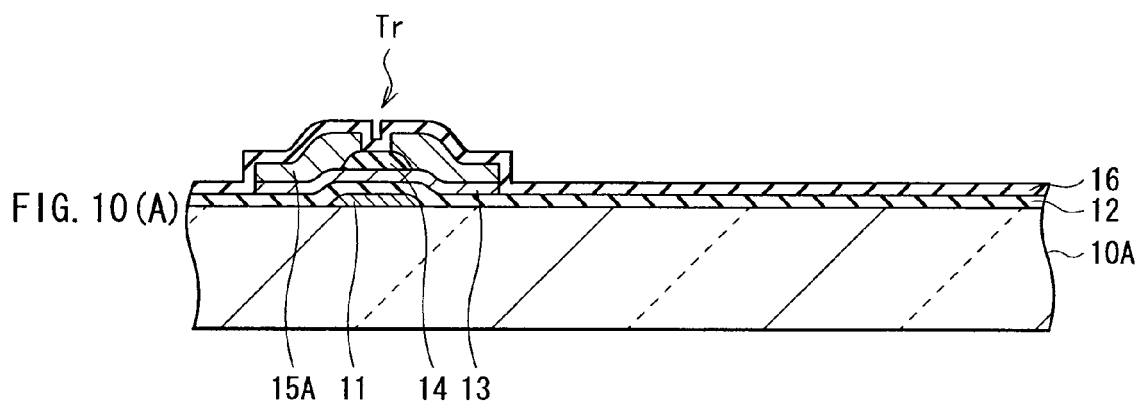
FIG. 10 is a sectional view showing a part of main steps of a method of manufacturing the light-emitting display shown in FIG. 9.

At first, as shown in FIG. 10(A), the thin film transistors Tr are formed on the transparent substrate 10A as in the case of the first embodiment, and the passivation insulating film 16 is uniformly formed on the thin film transistors Tr. However, unlike the first embodiment, the contact section 22A is not formed in the same layer as the wiring layer 15A.

Figure 10B:
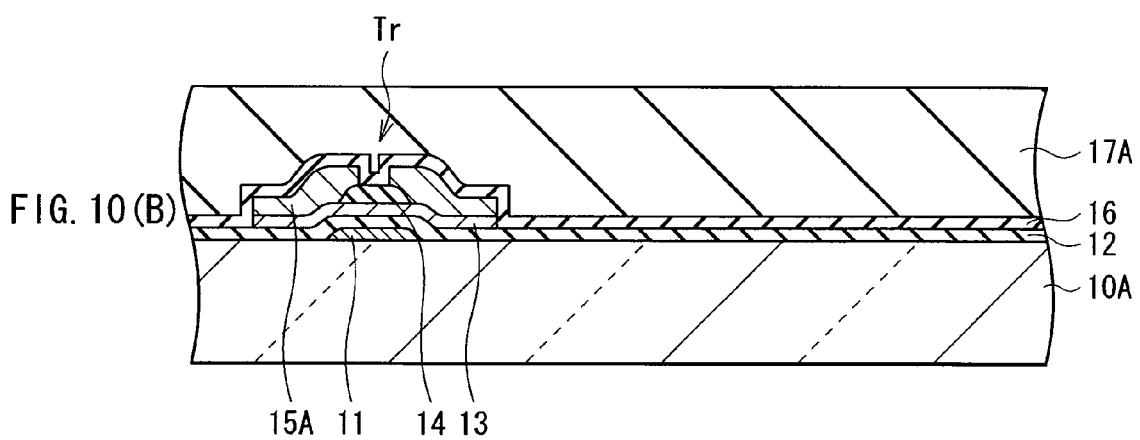

Next, as shown in FIG. 10(B), as in the case of the first embodiment, the planarization insulating film 17A is uniformly formed on the passivation insulating film 16.

Figure 11A:
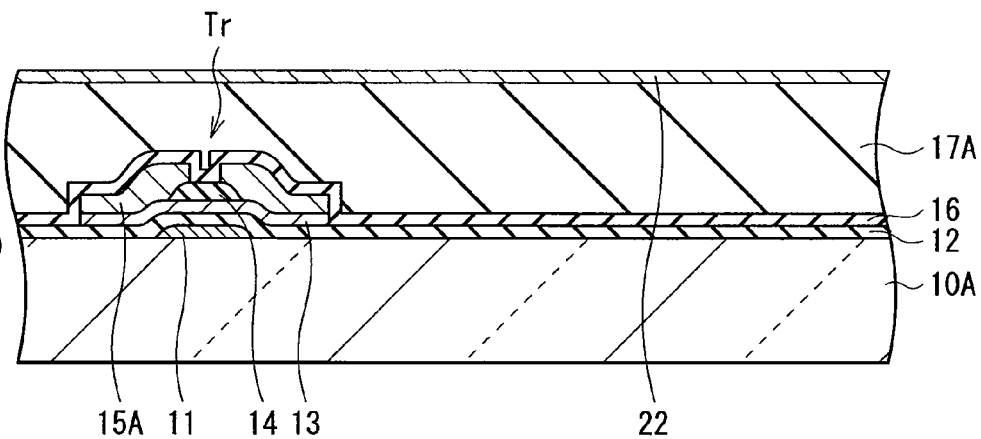
FIG. 11 is a sectional view showing a step following FIG. 10.
Figure 11B:
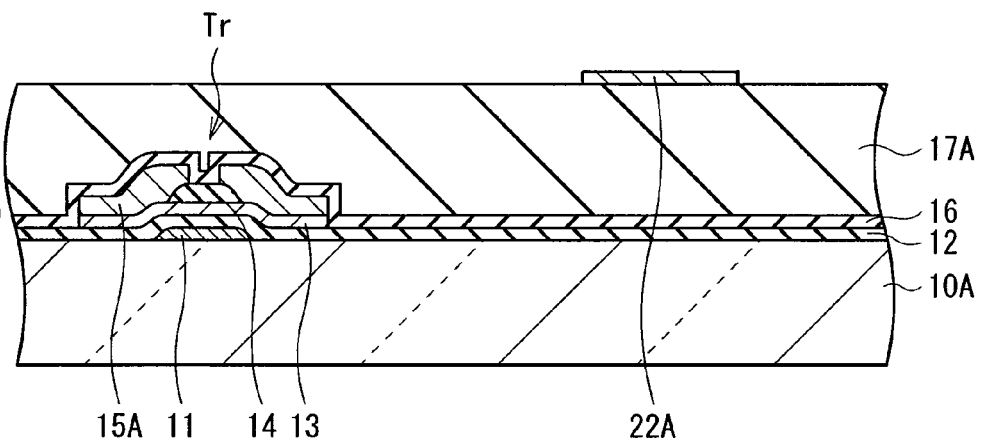

Next, as shown in FIG. 11(A), a metal layer 22 for forming the contact section 22A is uniformly formed with a thickness of, for example, approximately 50 nm by, for example, a sputtering method. Then, as shown in FIG. 11(B), the metal layer 22 is selectively etched by, for example, a photolithography method to form the contact section 22A in a part of a region corresponding to a region between the thin film transistors Tr as in the case of the first embodiment.

Figure 12A:
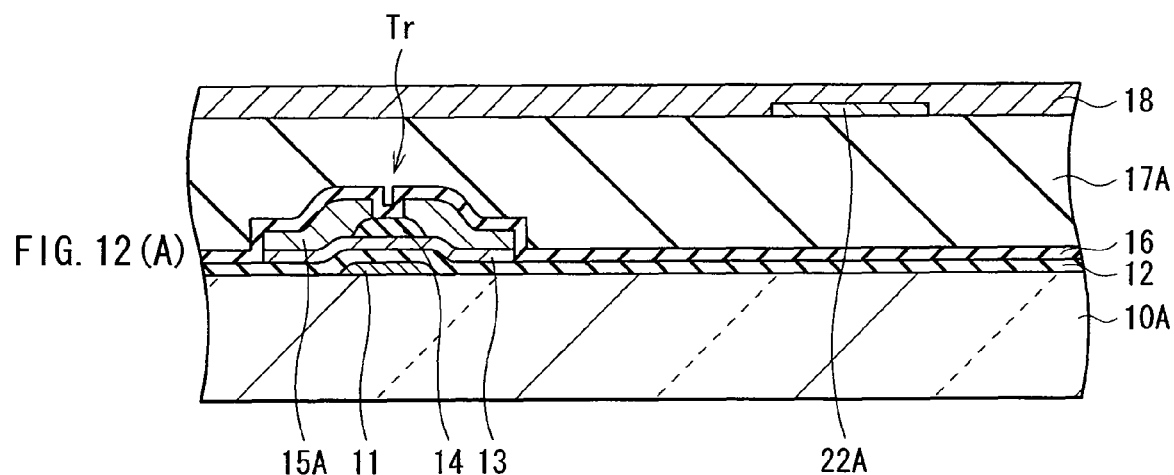
FIG. 12 is a sectional view showing a step following FIG. 11.
Figure 12B:
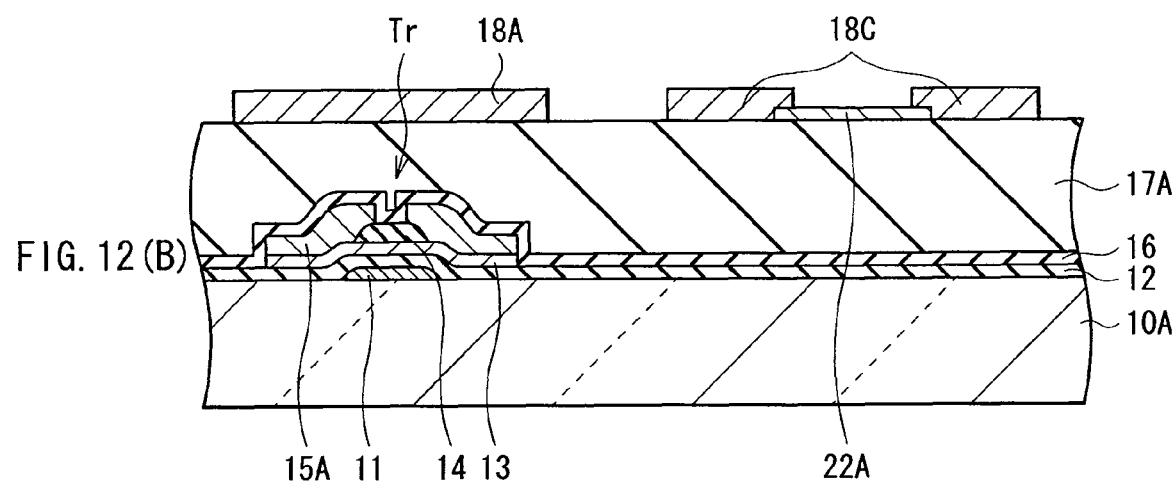

Next, as shown in FIG. 12(A), the metal layer 22 for forming the first electrode 18A and the auxiliary wiring 18C is uniformly formed on the contact section 22A and the planarization insulating film 17A as in the case of the first embodiment. Then, as shown in FIG. 12(B), the metal layer 22 is selectively etched by, for example, a photolithography method to form each first electrode 18A corresponding to a region where each thin film transistor Tr is formed, and to form the auxiliary wiring 18C so as to be partially electrically connected to the contact section 22A in a region corresponding to a region between the thin film transistors Tr. In addition, also at the time of etching the metal layer 22, as in the case of the first embodiment, the contact section 22A is made of a material with high etching selectivity with respect to the metal layer 22, so there is no possibility that the contact section 22A is etched together with the metal layer 22.

Next, as shown in FIG. 13(A), as in the case of the first embodiment, the interelectrode insulating film 21 is formed in a predetermined shape on the planarization insulating film 17A, the first electrodes 18A, the auxiliary wiring 18C and the contact section 22A, that is, the interelectrode insulating film 21 is formed so that each first electrode 18A and each organic light-emitting layer 19 which is formed in a later step are separated from other first electrodes 18A and other organic light-emitting layers 19. Moreover, at this time, as shown by a reference numeral P3 in the drawing, a region corresponding to the contact section 22A is selectively removed by, for example, a photolithography method to form an aperture having a side surface with a forward tapered shape. Then, as in the case of the first embodiment, the aperture is formed through the use of a halftone mask, or an exposure process is performed a plurality of times through the use of a plurality of masks having different sizes of aperture portions so that the tilt angle of the aperture becomes as gentle as possible.

Next, as shown in FIG. 13(B), after each organic light-emitting layer 19 is formed on each first electrode 18A as in the case of the first embodiment, the second electrode 20 is uniformly formed on the organic light-emitting layers 19, the interelectrode insulating film 21, the planarization insulating film 17A and the contact section 22A as in the case of the first embodiment. At this time, as in the case of the first embodiment, the thickness of the second electrode 20 is adjusted in consideration of the tilt angle of the forward tapered shape of the aperture in the interelectrode insulating film 21 so as not to cause a break in the second electrode 20 or an increase in resistance in a tilt portion of the aperture.

Then, finally, the protective film 23 and the sealing resin 17B are uniformly formed in this order on the second electrode 20, and they are covered with the transparent substrate 10B, thereby the organic EL display 2 according to the embodiment shown in FIG. 9 is manufactured.

As described above, also in the embodiment, the second electrode 20 and the auxiliary wiring 18C are connected to each other through the conductive contact section 22A, and only a part of the auxiliary wiring 18C is connected to the contact section 22A, so the same functions and effects as those in the first embodiment are obtained. In other words, even if the surface of the auxiliary wiring 18C is oxidized, an increase in connection resistance can be prevented, and a restriction on layout is not imposed at the time of forming the contact section 22A, so while the degree of freedom on layout and lower power consumption are maintained, the display quality of the organic EL display can be improved.

Third Embodiment

Next, a light-emitting display according to a third embodiment of the invention will be described below. In addition, like components are denoted by like numerals as of the first and second embodiments and will not be further described.

Figure 14:
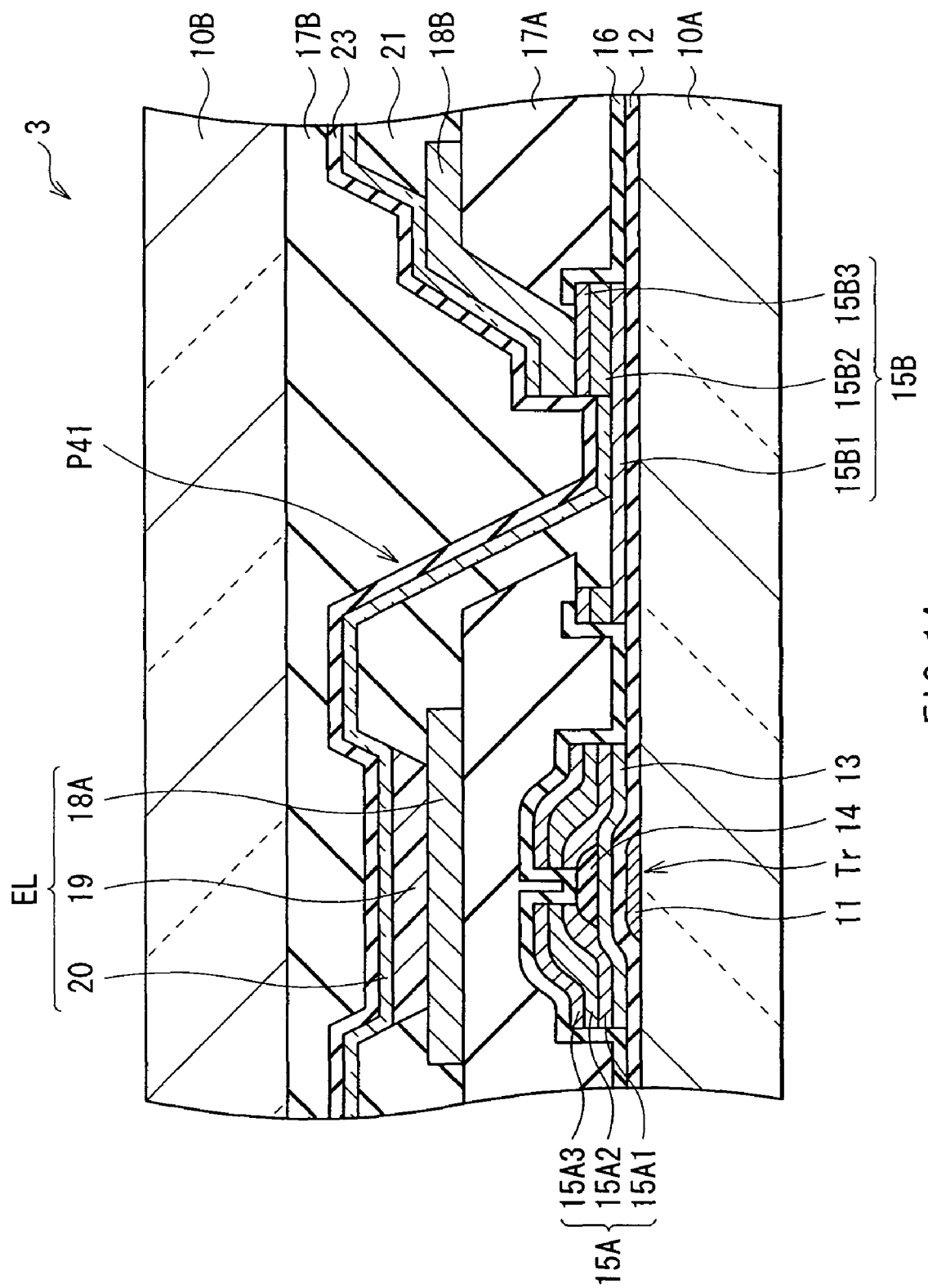
FIG. 14 is a sectional view showing the configuration of a light-emitting display according to a third embodiment.

FIG. 14 shows a sectional configuration of the light-emitting display (an organic EL display 3) according to the embodiment. In the organic EL display 3, the wiring layer 15A and the contact section 15B are a multilayer film in which layers 15A1, 15A2 and 15A3 are laminated in order from the transparent substrate 10A side and a multilayer film in which layers 15B1, 15B2 and 15B3 are laminated in order from the transparent substrate 10A side, respectively. At least an uppermost layer (for example, the layer 15A3 or 15A2 or the layer 15B3 or 15B2) of each of the multilayer films is made of such a material (for example, Mo or Al) that its selectivity is reduced at the time of etching the first electrode 18A and the auxiliary wiring 18B (low etching selectivity with respect to the first electrode 18A or the like is shown), and a lower layer (for example, the layer 15A2 or 15A1 or the layer 15B2 or 15B1) than the layer made of such a material showing low etching selectivity is made of such a material (for example, Ti) that its selectivity is increased at the time of etching the first electrode 18A and the auxiliary wiring 18B (high etching selectivity with respect to the first electrode 18A or the like is shown). More specifically, the multilayer films are configured of, for example, Mo/Al/Ti in order of the layers 15A3, 15A2 and 15A1 and the layers 15B3, 15B2 and 15B1. Thereby, as will be described later, a part of an upper layer (in this case, the layers 15B3 and 15B2) of the contact section 15B is selectively removed at the time of etching the first electrode 18A and the auxiliary wiring 18B. Moreover, in the organic EL display 3, as shown by a reference numeral P41 in the drawing, the aperture of the interelectrode insulating film 21 is formed inside of the aperture of the planarization insulating film 17A. In addition, configurations of other components are the same as those in the organic EL display 1 described in the first embodiment, and the second electrode 20 and the auxiliary wiring 18B are connected to each other through the contact section 15B.

Next, a method of manufacturing the organic EL display 3 will be described below referring to FIGS. 15 to 17. FIGS. 15 to 17 show sectional views of a part of steps of manufacturing the organic EL display 3.

Figure 15A:
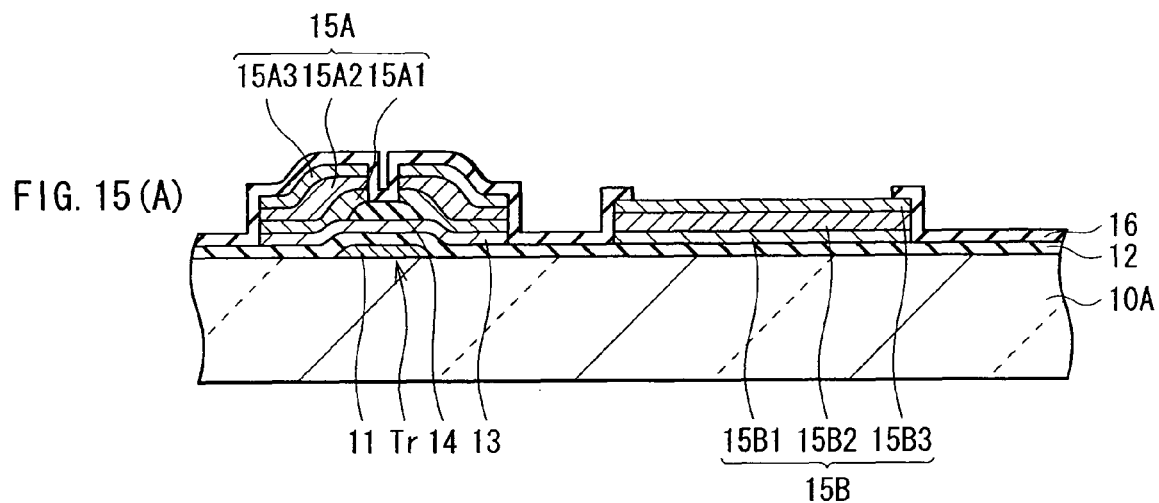
FIG. 15 is a sectional view showing a part of main steps of a method of manufacturing the light-emitting display shown in FIG. 14.

At first, as shown in FIG. 15(A), as in the case of the first embodiment, the gate electrode 11, the gate insulating film 12, the silicon film 13, the stopper insulating film 14 and the wiring layer 15A are laminated in this order on the transparent substrate 10A to form each of a plurality of thin film transistors Tr in, for example, a matrix form on the transparent substrate 10A. Moreover, when the wiring layer 15A is formed, as in the case of the first embodiment, the same material as that of the wiring layer 15A is used to form the contact section 15B together with the wiring layer 15A. However, in the embodiment, as described above, the wiring layer 15A and the contact section 15B are configured of a multilayer film including the layers 15A1 to 15A3 and a multilayer film including the layers 15B1 to 15B3, respectively. More specifically, in the case where the metal layer 18 which will be described later is etched by a combination of RIE and wet etching, for example, a multilayer film of Mo/Al/Ti can be formed, and the film thickness in this case is, for example, approximately Mo/Al/Ti=50 nm/500 nm/50 nm. In addition, as in the case of the first embodiment, the passivation insulating film 16 is uniformly formed on the thin film transistors Tr and the contact section 15B.

Figure 15B:
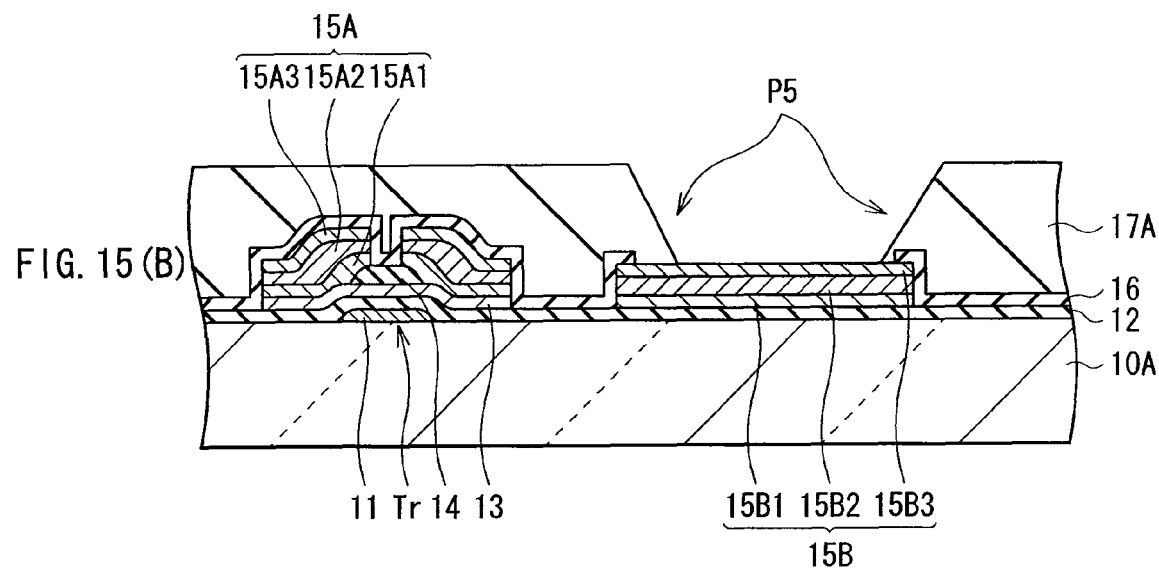

Next, as shown in FIG. 15(B), as in the case of the first embodiment, the planarization insulating film 17A is uniformly formed on the passivation insulating film 16. Then, as in the case of the first embodiment, an aperture having a side surface with a forward tapered shape shown by a reference numeral P5 in the drawing is formed in a region corresponding to the contact section 15B.

Figure 16A:
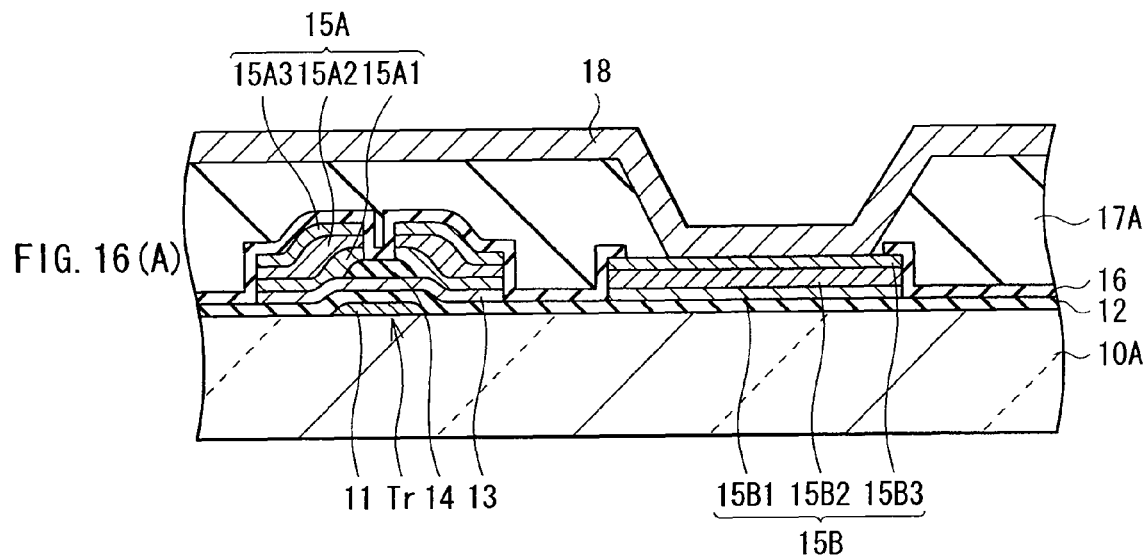
FIG. 16 is a sectional view showing a step following FIG. 15.

Next, as shown in FIG. 16(A), as in the case of the first embodiment, the metal layer 18 is uniformly formed through the use of the material of the first electrode 18A and the auxiliary wiring 18B on the planarization insulating film 17A and the contact section 15B.

Figure 16B:
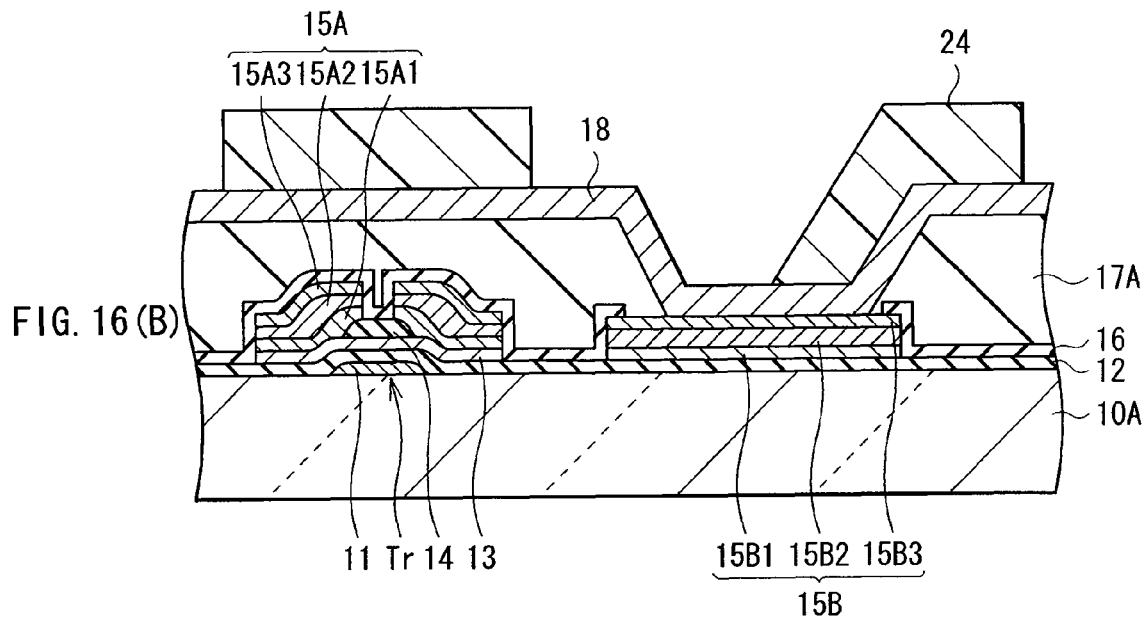
Figure 17A:
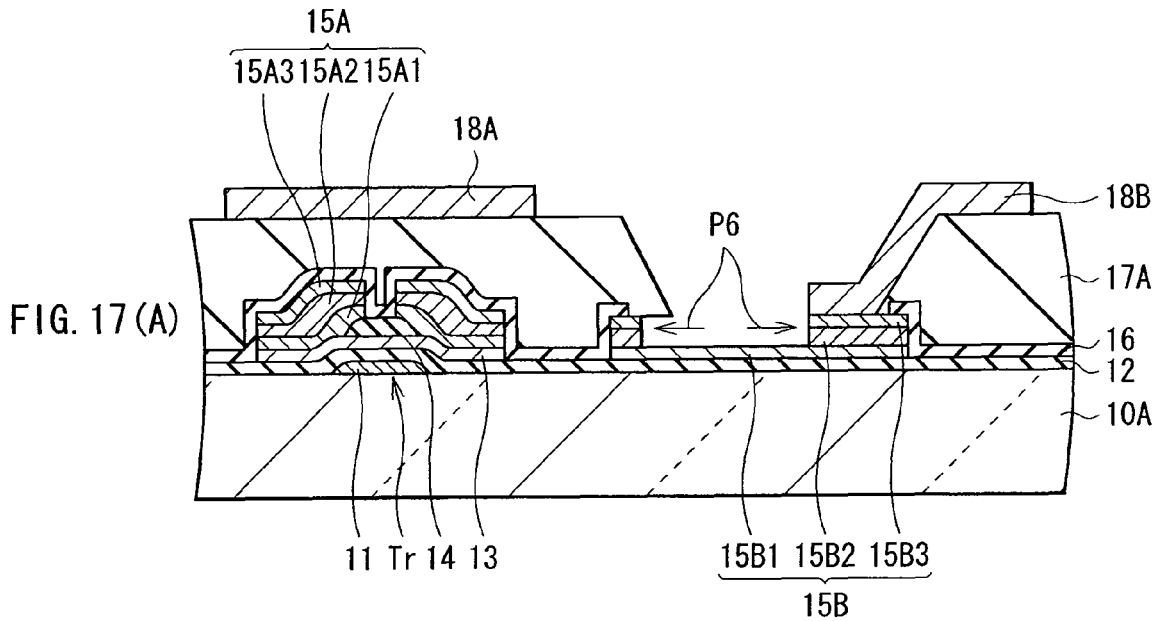
FIG. 17 is a sectional view showing a step following FIG. 16.

Next, as shown in FIG. 16(B), to selectively etch the metal layer 18 by, for example, a photolithography method, a photoresist film 24 having a selective pattern shown in the drawing is formed on the metal layer 18. Then, when the metal layer 18 is etched by, for example, a combination of RIE and wet etching as described above, the first electrode 18A and the auxiliary wiring 18B which have, for example, shapes shown in FIG. 17(A) are formed, respectively. In this case, the layers 15B3 and 15B2 as an upper layer portion of the contact section 15B are made of a material with low etching selectivity with respect to the metal layer 18 as described above, so at the time of etching the metal layer 18, a part of the layers 15B3 and 15B2 (more specifically, a portion where the photoresist film 24 is not formed) is etched together with the metal layer 18. On the other hand, the layer 15B1 as a lower layer portion of the contact section 15B is made of a material with high etching selectivity with respect to eth metal layer 18 as described above, so at the time of etching the metal layer 18, the layer 15B1 is not etched together with the metal layer 18. In addition, at the time of etching, as shown by a reference numeral P6 in the drawing, side etching also occurs.

Figure 17B:
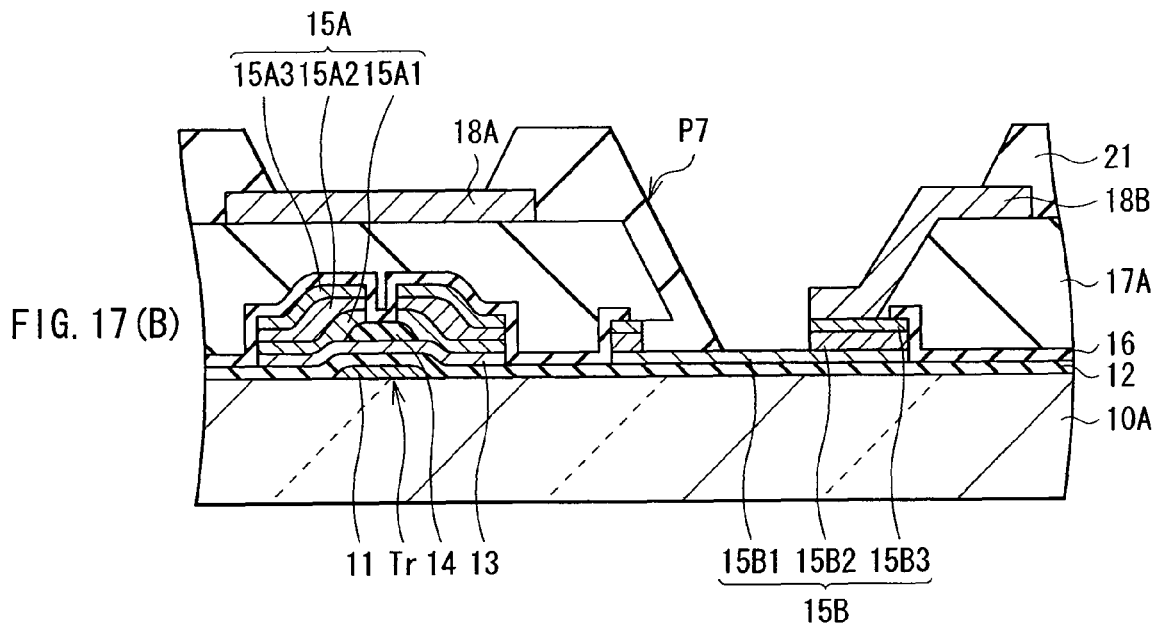

Next, as shown in FIG. 17(B), as in the case of the first embodiment, the interelectrode insulating film 21 is uniformly formed on the planarization insulating film 17A, the first electrodes 18A and the auxiliary wiring 18B, and patterning is performed on the interelectrode insulating film 21 so that each first electrode 18A and each organic light-emitting layer 19 which is formed in a later step are separated from other first electrodes 18A and other organic light-emitting layers 19. At this time, as in the case of the first embodiment, a region corresponding to the contact section 15B is selectively removed to form an aperture having a side surface with a forward tapered shape. However, in the embodiment, side etching shown by the reference numeral P6 in FIG. 17(A) occurs, so to prevent a break or an increase in resistance in the second electrode 20 which is formed in a later step, as shown by a reference numeral P7 in FIG. 17(B), the aperture in the interelectrode insulating film 21 is formed inside of the aperture of the planarization insulating film 17A.

After that, as in the case of the first embodiment, the organic light-emitting layer 19 is formed on each first electrode 18A, and the second electrode 20 is uniformly formed on the organic light-emitting layer 19, the interelectrode insulating film 21, the planarization insulating film 17A, the contact section 15B and the auxiliary wiring 18B. Then, the protective film 23 is uniformly formed on the second electrode 20, and the sealing resin 17B is uniformly formed on the protective film 23, and the sealing resin 17B is covered by the transparent substrate 10B, thereby the organic EL display 3 according to the embodiment shown in FIG. 14 is manufactured.

As described above, also in the embodiment, the second electrode 20 and the auxiliary wiring 18B are connected to each other through the conductive contact section 15B, and only a part of the auxiliary wiring 18B is connected to the contact section 15B, so the same functions and effects as those in the first embodiment are obtained. In other words, even if the surface of the auxiliary wiring 18B is oxidized, an increase in connection resistance can be prevented, and a restriction on layout is not imposed at the time of forming the contact section 15B, so while the degree of freedom on layout and low power consumption are maintained, the display quality of the organic EL display can be improved.

Moreover, the wiring layer 15A and the contact section 15B each are configured of multilayer films (the layers 15A1 to 15A3 and the layers 15B1 to 15B3), and at least an uppermost layer of each of the multilayer films is made of a material showing low etching selectivity with respect to the first electrode 18A or the like, and a lower layer than the layer made of such a material showing low etching selectivity is made of a material showing high etching selectivity with respect to the first electrode 18A or the like, so a part of an upper layer (in the case of FIG. 14, the layers 15B3 and 15B2) of the contact section 15B is selectively removed at the time of etching the first electrode 18A and the auxiliary wiring 18B; however, there is no possibility that a lower layer (in the case of FIG. 14, the layer 15B1) of the contact section 15B is selectively removed at the time of etching the first electrode 18A and the auxiliary wiring 18B. Therefore, when the wiring layer 15A and the contact section 15B are configured of multilayer films, some layers of the multilayer film can be made of a material showing low etching selectivity with respect to the first electrode 18A or the like, and compared to the first embodiment, the range of choices for the material of the wiring layer 15A or the contact section 15B can be expanded. Therefore, for example, at the time of etching the first electrode 18A and the auxiliary wiring 18B, a material which is resistant to an etching defect occurring at the time of etching can be chosen, and in this case, yields can be improved.

Moreover, the side surfaces of the apertures in the planarization insulating film 17A and the interelectrode insulating film 21 each have a forward tapered shape with a wide top and a narrow bottom, and the aperture of the interelectrode insulating film 21 is formed inside of the aperture of the planarization insulating film 17A, so a break or an increase in resistance in the second electrode 20 caused by side etching at the time of etching the metal layer 18 can be prevented, and a decline in manufacturing yields due to this can be prevented.

Figure 18:
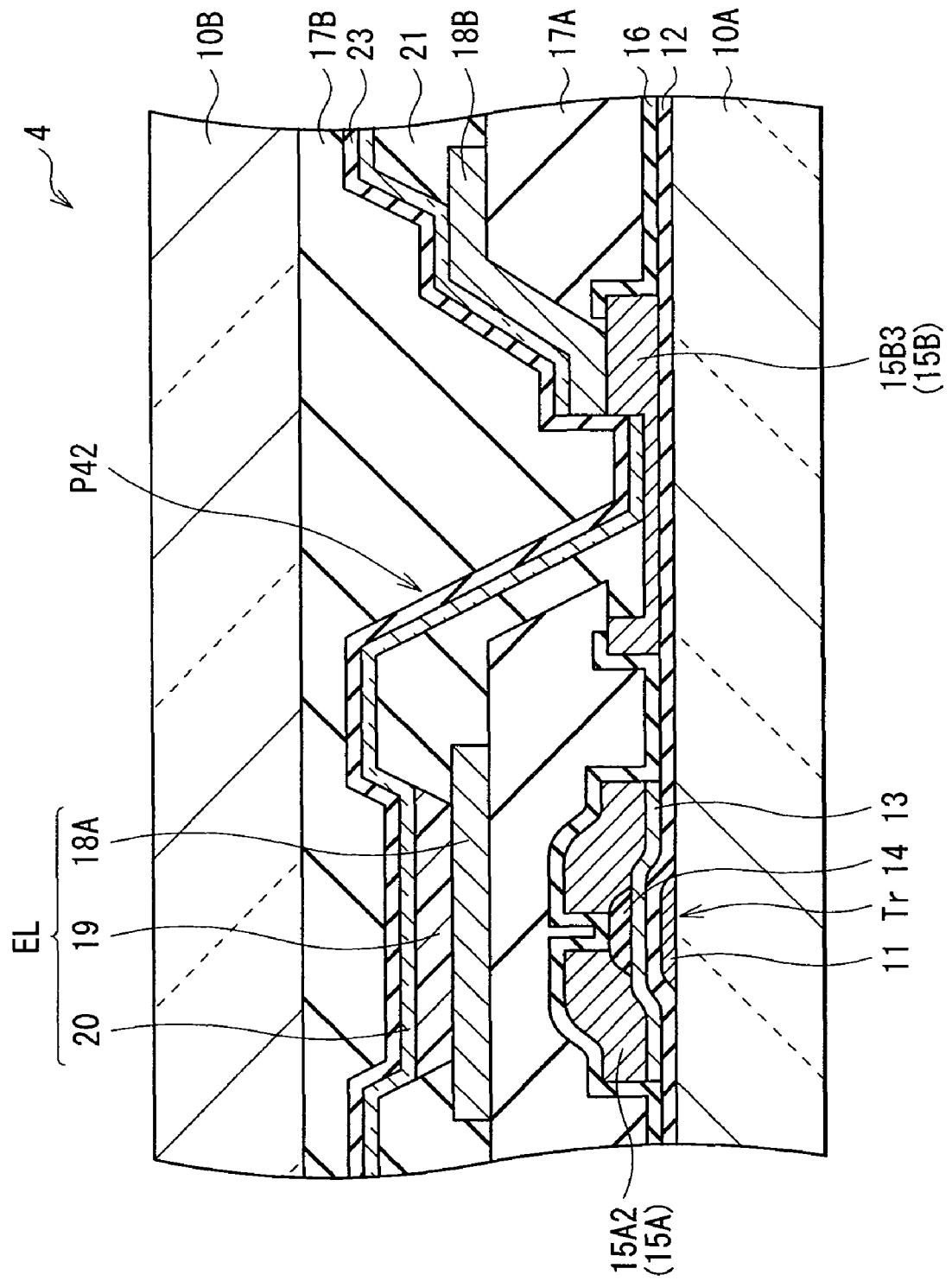
FIG. 18 is a sectional view showing the configuration of a light-emitting display according to a modification example of the third embodiment.

In addition, in the embodiment, the case where like the organic EL display 3 shown in FIG. 14, the wiring layer 15A and the contact section 15B each are configured of a multilayer film, and at least an uppermost layer of the multilayer film is made of a material showing low etching selectivity with respect to the first electrode 18A or the like, and a lower layer than the layer made of the material showing such low etching selectivity is made of a material showing high etching selectivity with respect to the first electrode 18A or the like is described; however, for example, like an organic EL display 4 shown in FIG. 18, the wiring layer 15A and the contact section 15B each may be configured of a single layer (for example, the layer 15A3 and the layer 15B3) made of low etching selectivity with respect to the first electrode 18A or the like, and the thicknesses of the layers 15A3 and 15B3 may be set so that only an upper layer portion of the contact section 15B is partially removed at the time of forming the first electrode 18 by patterning (in other words, the thicknesses of the layers 15A3 and 15B3 may be set to a thickness to an extent to which a part of the contact section 15B is not penetrated and removed). In the case of such a configuration, the whole wiring layer 15A or the whole contact section 15B can be made of a material showing low etching selectivity with respect to the first electrode 18A or the like, and compared to the first embodiment, the range of choices of the material of the wiring layer 15A or the contact section 15B can be expanded. In addition, even in the organic EL display 4, as in the case of the organic EL display 3, as shown by a reference numeral P42 in the drawing, it is preferable that the side surfaces of the apertures in the planarization insulating film 17A and the interelectrode insulating film 21 each have a forward tapered shape with a wide top and a narrow bottom, and the aperture of the interelectrode insulating film 21 be formed inside of the aperture of the planarization insulating film 17A.

Although the present invention is described referring to the first, second and third embodiments, the invention is not limited to these embodiments, and can be variously modified.

Figure 19A:
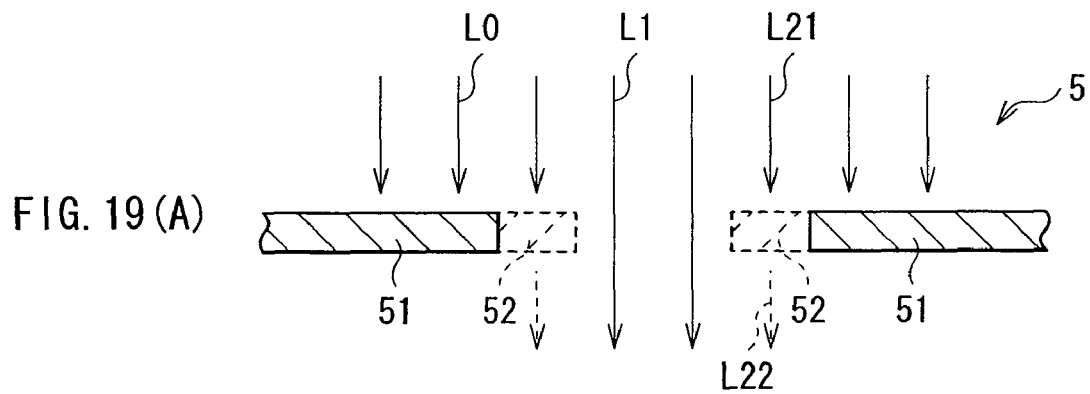
FIG. 19 is a sectional view showing the configuration of a mask used in a method of manufacturing a light-emitting display according to a modification example of the invention.
Figure 19B:
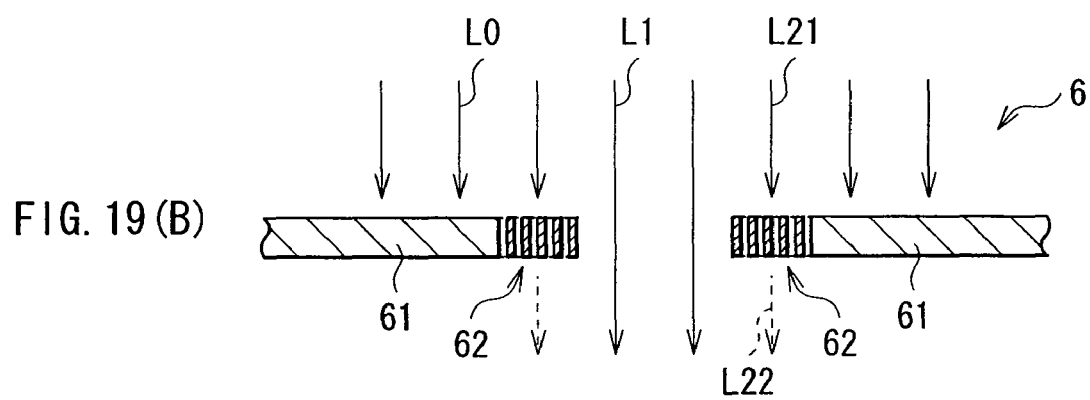
Figure 19C:
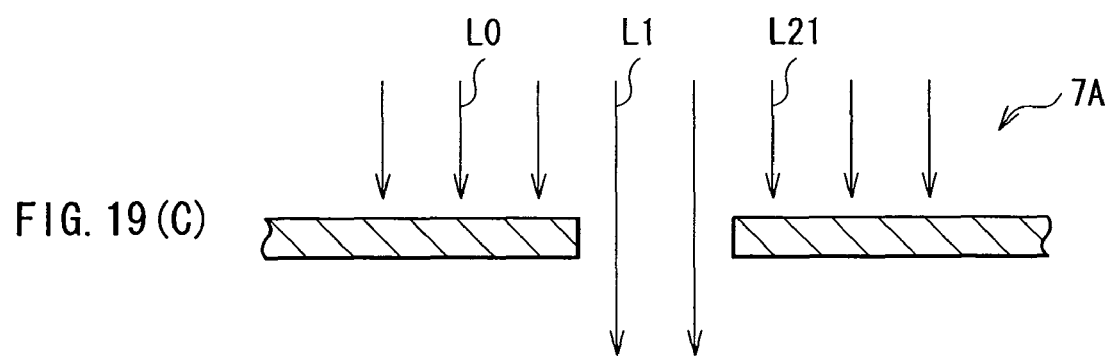
Figure 19D:
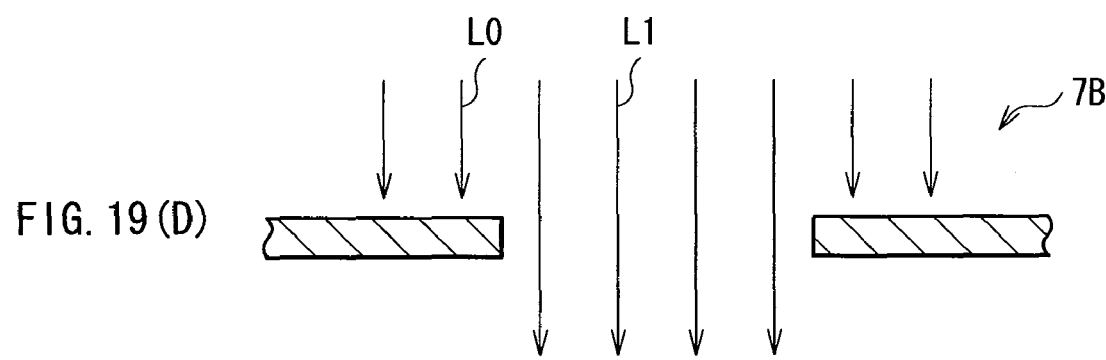
Figure 20:
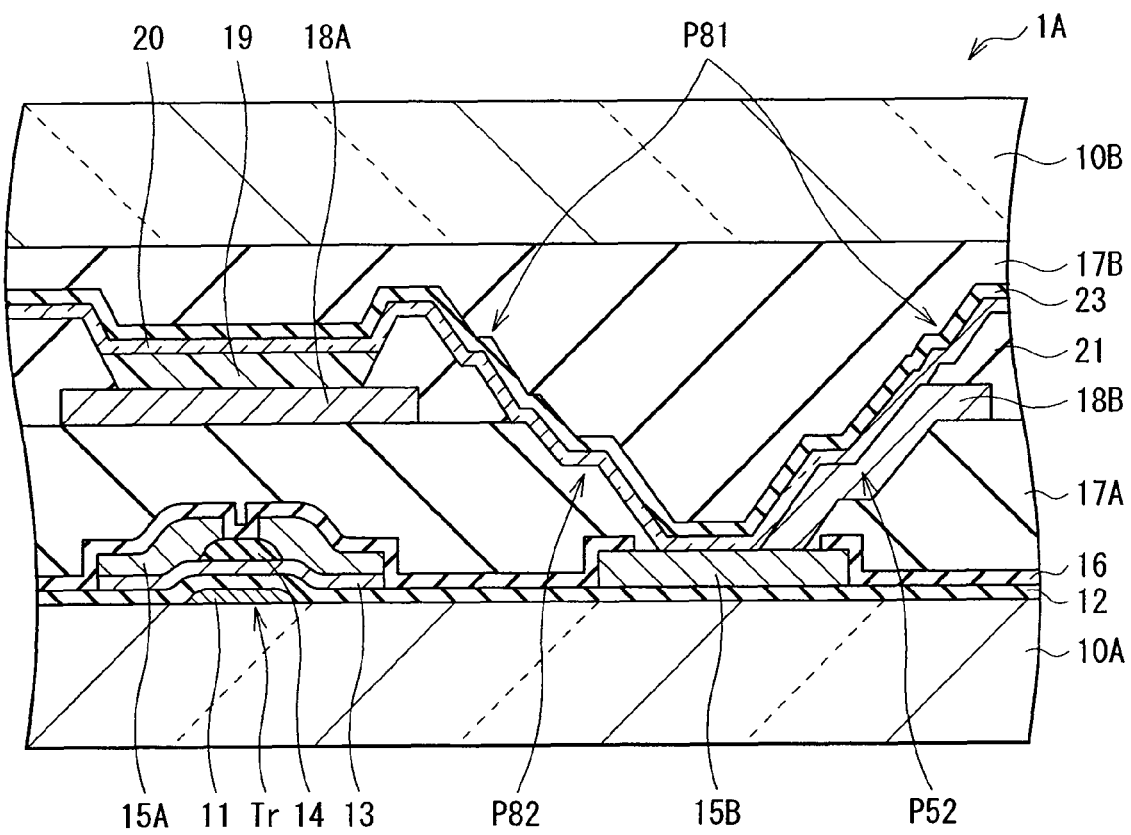
FIG. 20 is a sectional view showing the configuration of a light-emitting display according to a modification example of the first embodiment corresponding to the case where the mask shown in FIG. 19 is used.
Figure 21:
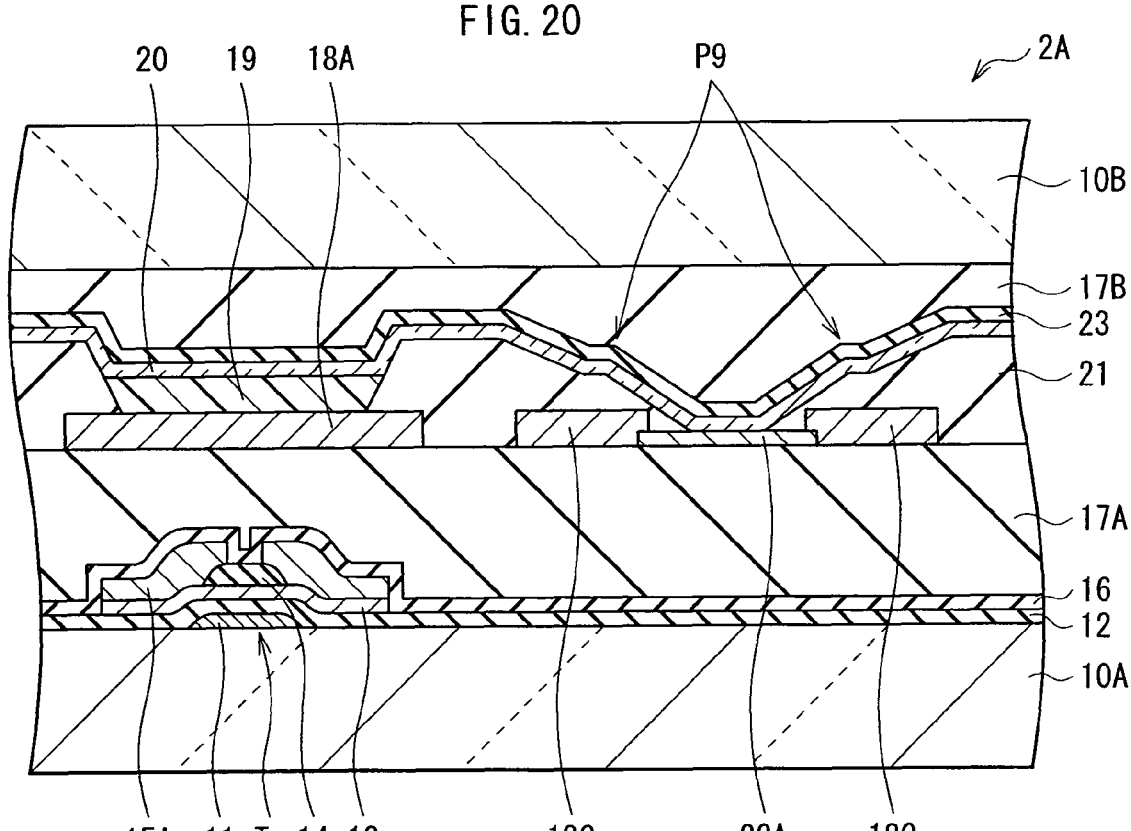
FIG. 21 is a sectional view showing the configuration of a light-emitting display according to a modification example of the second embodiment corresponding to the case where the mask shown in FIG. 19 is used.

For example, when the aperture is formed in the planarization insulating film 17A or the interelectrode insulating film 21 described in the above-described embodiments, for example, as shown in FIGS. 19(A) and 19(B), a halftone mask 5 or a gray tone mask 6 having partial transmission sections 52 and 62 which allow a part of exposure light L21 to pass therethrough as exposure light L22 in addition to a portion allowing exposure light L1 to pass therethrough or light-shielding sections 51 and 61 shielding exposure light L0 may be used. Moreover, for example, as shown in FIGS. 19(C) and 19(D), exposure may be performed a plurality of times through the use of a plurality of masks (in this example, two masks 7A and 7B) with different areas of portions allowing exposure light L1 to pass therethrough. In the case of such a configuration, for example, like organic EL displays 1A and 2A shown in FIGS. 20 and 21, respectively (which correspond to modification examples of the organic EL displays 1 and 2 according to the first and second embodiments, respectively, and modification examples of the organic EL displays 3 and 4 according to the third embodiment are not shown, but are the same as in the case of the organic EL display 1A), a side surface portion of apertures in the planarization insulating film 17A and the interelectrode insulating film 21 can be formed in a step-like shape having more steps as shown by reference numerals P81, P82 and P9 in the drawing, thereby the tilt angle can become gentler. Therefore, in addition to the effects in the above-described embodiments, a break or an increase in resistance in the second electrode 20 can be prevented.

Further, the position where the contact section is formed is not limited to the position shown in FIG. 1, 9 or the like described in the above-described embodiments, that is, the same layer as the wiring layer 15A or the same layer as the first electrode 18A and the auxiliary wiring 18B, and the contact section may be formed in another layer.

Moreover, the light-emitting display according to the invention is not limited to the organic EL display including an organic EL element described in the above-described embodiments, and is applicable to any other light-emitting display.

Further, for example, the material, the thickness, the forming method, the forming conditions and the like of each component described in the above embodiments are not limited to those described above, and each component may be made of any other material with any other thickness, and the component may be formed by any other forming method under any other forming conditions.

Moreover, in the above-described embodiments, the configuration of the organic EL display is specifically described; however, it is not necessary to include all layers, or any other layer, for example, a color filter layer on the transparent substrate 10B side may be included.

The invention claimed is:

1. A light-emitting display comprising a plurality of drive elements and a first wiring layer electrically connected to the drive elements, display comprising, when viewed in cross section:
    a like plurality of first electrodes respectively corresponding to the drive elements, and positioned over the drive elements and the wiring layer;
    a like plurality of light emission sections formed on the first electrodes, respectively;
    a common second electrode formed of a material allowing light from the light emission sections to pass therethrough and arranged over the plurality of light emission sections;
    an auxiliary wiring layer with a resistance lower than that of the common second electrode; and
    a conductive contact layer electrically connecting the common second electrode and the auxiliary wiring layer, a portion of the common second electrode in direct contact with the conductive contact layer, and a portion of the auxiliary wiring layer positioned above and in direct contact with the conductive contact layer.

2. The light-emitting display according to claim 1, characterized in that the first wiring layer and the conductive contact layer are formed by patterning one conductive layer.

3. The light-emitting display according to claim 2, characterized in that the common second electrode and the auxiliary wiring layer are partially connected to each other through the conductive contact layer.

4. The light-emitting display according to claim 2, characterized in that the conductive layer is a multilayer film, the multilayer film including:
    a low etching selectivity film in at least an uppermost layer of the multilayer film and made of a material having relatively low etching selectivity with respect to the first electrodes, and
    a high etching selectivity film in a layer lower than the low etching selectivity film and made of a material having relatively high etching selectivity with respect to the first electrodes, and
    the low etching selectivity film in the conductive contact layer is partially removed.

5. The light-emitting display according to claim 4, characterized in that:
    a planarization insulating layer and an interelectrode insulating layer, each having an aperture in a region corresponding to the conductive contact layer, are between the conductive contact layer and the common second electrode, and
    the interelectrode insulating layer is on the planarization insulating layer, and the aperture of the interelectrode insulating layer is inside of the aperture of the planarization insulating layer.

6. The light-emitting display according to claim 2, characterized in that:
    the conductive layer is made of a material with relatively low etching selectivity with respect to the first electrodes, and
    an upper layer portion of the conductive contact layer is partially removed.

7. The light-emitting display according to claim 6, characterized in that:
    a planarization insulating layer and an interelectrode insulating layer each having an aperture in a region corresponding to the conductive contact layer are formed between the conductive contact layer and the common second electrode, and
    the interelectrode insulating layer is formed on the planarization insulating layer, and the aperture of the interelectrode insulating layer is formed inside of the aperture of the planarization insulating layer.

8. The light-emitting display according to claim 1, characterized in that:

an insulating layer having an aperture in a region corresponding to the conductive contact layer is between the conductive contact layer and the common second electrode, and the side surface of the aperture has a step-like shape with a wide top and a narrow bottom.

9. The light-emitting display according to claim 1, characterized in that the conductive contact layer is made of a material having relatively high etching selectivity with respect to the first electrodes.

10. A method of manufacturing a light-emitting display comprising the steps of:

forming a plurality of drive elements and a first wiring layer on a substrate, and electrically connecting the plurality of drive elements and the wiring layer;

forming a first conductive layer on the drive elements and the wiring layer;

forming a like plurality of first electrodes corresponding to the plurality of drive elements, respectively, as well as an auxiliary wiring layer by patterning the first conductive layer;

forming a respective light emission section on each of the first electrodes;

forming a common second electrode of a material allowing light from each light emission section to pass therethrough on the plurality of the light emission sections; and forming a conductive contact layer, and electrically connecting the common second electrode and the auxiliary wiring layer through the conductive contact layer, wherein, the auxiliary wiring layer is formed of a material with resistance that is lower than that of the common second electrode, and a portion of the common second electrode is in direct contact with the conductive contact layer, and a portion of the auxiliary wiring layer is positioned above and in direct contact with the conductive contact layer.

11. The method of manufacturing a light-emitting display according to claim 10, characterized in that one second conductive layer is formed, and the first wiring layer and the conductive contact layer are formed by patterning the second conductive layer.

12. The method of manufacturing a light-emitting display according to claim 11, characterized in that the step of electrically connecting the common second electrode and the auxiliary wiring layer includes partially connecting the common second electrode and the auxiliary wiring layer to each other through the conductive contact layer.

13. The method of manufacturing a light-emitting display according to claim 11, characterized in that:

the second conductive layer is made of a multilayer film in which a low etching selectivity film made of a material having relatively low etching selectivity with respect to the first electrodes and is placed in at least an uppermost layer, and a high etching selectivity film made of a material having relatively high etching selectivity with respect to the first electrodes and is placed in a lower layer than the low etching selectivity film.

14. The method of manufacturing a light-emitting display according to claim 13, further comprising the steps of:

forming a planarization insulating layer having an aperture in a region corresponding to the conductive contact layer between the conductive contact layer and the common second electrode; and forming an interelectrode insulating layer having an aperture in a region corresponding to the conductive contact layer between the planarization insulating layer and the common second electrode, wherein, the aperture of the interelectrode insulating layer is formed inside of the aperture of the planarization insulating layer.

15. The method of manufacturing a light-emitting display according to claim 11, characterized in that:

the second conductive layer is formed of a material having relatively low etching selectivity with respect to the first electrodes, and the thickness of the second conductive layer is such that only an upper layer portion of the conductive contact layer is partially removed at the time of forming the first electrodes by patterning.

16. The method of manufacturing a light-emitting display according to claim 15, further comprising the steps of:

forming a planarization insulating layer having an aperture in a region corresponding to the conductive contact layer between the conductive contact layer and the common second electrode; and forming an interelectrode insulating layer having an aperture in a region corresponding to the conductive contact layer between the planarization insulating layer and the common second electrode, wherein, the aperture of the interelectrode insulating layer is formed inside of the aperture of the planarization insulating layer.

17. The method of manufacturing a light-emitting display according to claim 10, further comprising the steps of:

forming an insulating layer between the conductive contact layer and the common second electrode; and forming an aperture having a step-like side surface with a wide top and a narrow bottom by selectively removing a region corresponding to the conductive contact layer in the insulating layer.

18. The method of manufacturing a light-emitting display according to claim 17, characterized in that the aperture having a step-like side surface is formed through the use of a halftone mask or a gray tone mask.

19. The method of manufacturing a light-emitting display according to claim 10, characterized in that the conductive contact layer is formed of a material showing high etching selectivity with respect to the first electrodes.

* * * * *